United States Patent
Inoue et al.

(10) Patent No.: US 8,988,116 B2
(45) Date of Patent: Mar. 24, 2015

(54) METHOD FOR DRIVING SEMICONDUCTOR DEVICE

(71) Applicant: Semiconductor Energy Laboratory Co., Ltd., Atsugi-shi, Kanagawa-ken (JP)

(72) Inventors: Hiroki Inoue, Kanagawa (JP); Tatsuya Onuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/721,120

(22) Filed: Dec. 20, 2012

(65) Prior Publication Data

US 2013/0162306 A1    Jun. 27, 2013

(30) Foreign Application Priority Data

Dec. 23, 2011    (JP) ................................. 2011-282429
May 10, 2012    (JP) ................................. 2012-108272

(51) Int. Cl.
    *H03K 3/00*      (2006.01)
    *H03K 17/06*     (2006.01)
    *G11C 11/403*    (2006.01)

(52) U.S. Cl.
    CPC ............ *H03K 17/063* (2013.01); *G11C 11/403* (2013.01); *G11C 2211/4016* (2013.01)
    USPC ............ 327/108; 327/170; 327/379; 327/389

(58) Field of Classification Search
    USPC ........................................ 327/108
    See application file for complete search history.

(56) References Cited

U.S. PATENT DOCUMENTS

| 4,466,081 A | 8/1984 | Masuoka |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,831,866 B1 | 12/2004 | Kirihata |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Lincoln Donovan
*Assistant Examiner* — Patrick Chen
(74) *Attorney, Agent, or Firm* — Fish & Richardson P.C.

(57) ABSTRACT

Provided is a method for driving a semiconductor device, which allows a reduction in scale of a circuit, reduce the power consumption, and increase the speed of reading data. An H level (data "1") potential or an L level (data "0") potential is written to a node of a memory cell. Potentials of a source line and a bit line are set to the same potential at an M level (L level<M level<H level) so that the potential of the node is held. When the potential of the bit line is maintained at the M level, data "1" is read and when the potential of the bit line is reduced to an L level, data "0" is read.

15 Claims, 16 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,088,052 B2 | 8/2006 | Kimura |
| 7,105,868 B2 | 9/2006 | Nause et al. |
| 7,123,500 B2 | 10/2006 | Ye et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0176400 A1 | 7/2010 | Asano et al. |
| 2010/0182224 A1 | 7/2010 | Iida et al. |
| 2011/0227072 A1* | 9/2011 | Inoue et al. ................... 257/57 |
| 2011/0228584 A1* | 9/2011 | Takemura ................... 365/72 |
| 2012/0033487 A1 | 2/2012 | Inoue et al. |
| 2012/0051116 A1 | 3/2012 | Inoue et al. |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 20041114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of Igzo Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$Ga_2ZnO_4$-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

\* cited by examiner

METHOD FOR DRIVING SEMICONDUCTOR DEVICE

BACKGROUND OF THE INVENTION

1. Field of the Invention

The present invention relates to a method for driving a semiconductor device.

In this specification, a semiconductor device means all types of devices that can function by utilizing semiconductor characteristics, and a semiconductor circuit, a memory device, an imaging device, a display device, an electro-optical device, an electronic device, and the like are all semiconductor devices.

2. Description of the Related Art

Storage devices using semiconductor elements are broadly classified into two categories: a volatile device that loses stored data when power supply stops, and a nonvolatile device that retains stored data even when power is not supplied.

A typical example of a volatile storage device is a dynamic random access memory (DRAM). A DRAM stores data in such a manner that a transistor included in a storage element is selected and electric charge is stored in a capacitor.

On the above-described principle, when data is read from a DRAM, charge in a capacitor is lost; thus, another writing operation is necessary every time data is read out. Moreover, since leakage current (off-state current) flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is a static random access memory (SRAM). An SRAM holds stored data by using a circuit such as a flip-flop and thus does not need refresh operation. This means that an SRAM has an advantage over a DRAM. However, since a circuit such as a flip-flop is used, an area occupied by a circuit is increased and cost per storage capacity is thus increased. Moreover, as in a DRAM, stored data in an SRAM is lost when power supply stops.

A typical example of a nonvolatile storage device is a flash memory. A flash memory includes a floating gate between a gate electrode and a channel formation region in a transistor and stores data by holding electric charge in the floating gate. Thus, a flash memory has advantages in that the data holding time is extremely long (almost permanent) and refresh operation which is necessary in a volatile storage device is not needed (for example, see Patent Document 1).

However, a gate insulating layer included in a storage element deteriorates by tunneling current generated in writing, so that the storage element stops its function after a predetermined number of writing operations. To reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for injecting charge into the floating gate or removing the charge, and a circuit therefor is required. Further, it takes a relatively long time to inject or remove charge, and it is not easy to increase the speed of writing and erasing data.

REFERENCE

Patent Document 1: Japanese Published Patent Application No. S57-105889

SUMMARY OF THE INVENTION

In view of the foregoing problems, an object of one embodiment of the present invention is to provide a method for driving a semiconductor device which can hold stored data even when not powered and which has an unlimited number of write cycles. Further, an object is to reduce the scale of a circuit in the semiconductor device. Furthermore, an object is to reduce the power consumption of the semiconductor device. In addition, an object is to increase the speed of reading data from the semiconductor device.

One embodiment of the present invention disclosed in this specification is a method for driving a semiconductor device including a nonvolatile memory cell which includes a writing transistor including an oxide semiconductor, a writing and reading transistor including a semiconductor material that is different from the material of the writing transistor, and a capacitor.

One embodiment of the present invention disclosed in this specification is a method for driving a semiconductor device in which a source electrode of a first transistor and a source electrode of a second transistor are electrically connected to a bit line; a gate electrode of the second transistor is electrically connected to a first word line; a drain electrode of the first transistor is electrically connected to a source line; one electrode of a capacitor is electrically connected to a second word line; and a gate electrode of the first transistor, a drain electrode of the second transistor, and the other electrode of the capacitor are electrically connected to each other to form a node where charge is stored. In a writing period, a potential of the first word line is set to a potential at which the second transistor is turned on, a potential of the second word line is set at an L level, a potential of the source line is set at an L level, and then an H level potential is supplied from the bit line to the node so that data "1" is written to the node or an L level potential is supplied from the bit line to the node so that data "0" is written to the node. In a holding period, the potential of the first word line is set at an L level, the potential of the second word line is set at an H level, and then the potentials of the source line and the bit line are set to the same potential at an M level (L level<M level<H level) so that the potential of the node is held. In a reading period, the potential of the first word line is set at the L level, the potential of the second word line is set at the L level, and then the potential of the source line is set at the L level; thus, the first transistor is maintained in an off state and the potential of the bit line is maintained at the M level, so that data "1" is read in the case where the potential held in the node is at the H level, and the first transistor is turned on and the potential of the bit line is reduced to the L level, so that data "0" is read in the case where the potential held in the node is at the L level.

One embodiment of the present invention disclosed in this specification is a method for driving a semiconductor device which includes a memory cell array including n (n is an integer of 2 or more) bit lines, k (k is an integer of 1 or more) source lines, m (m is an integer of 2 or more) first word lines, m second word lines, and a plurality of memory cells. In each of the memory cells, a source electrode of a first transistor and a source electrode of a second transistor are electrically connected to the bit line; a gate electrode of the second transistor is electrically connected to the first word line; a drain electrode of the first transistor is electrically connected to the source line; one electrode of a capacitor is electrically connected to the second word line; and a gate electrode of the first transistor, a drain electrode of the second transistor, and the other electrode of the capacitor are electrically connected to each other to form a node where charge is stored. In a writing period, a potential of the first word line to which a selected memory cell is electrically connected is set to a potential at which the second transistor is turned on, a potential of the second word line to which the selected memory cell is electrically connected is set at an L level, the potential of the second word line to which a non-selected memory cell is set at an H level, a potential of the source line to which the non-selected memory cell is electrically connected is set at an L level, and then an H level potential is supplied from the bit line to which the selected memory cell is electrically connected to the node of the selected memory cell so that data "1" is written to the node or an L level potential is supplied from the bit line to which the selected memory cell is electrically connected to the node of the selected memory cell so that data "0" is written to the node. In a holding period, the potentials of the m first word lines are set at an L level, the potentials of the m second word lines are set at an H level, and then the potentials of the k source lines and the n bit lines are set to the same potential at an M level (L level<M level<H level) so that the potentials of the nodes included in the respective memory cells are held. In a reading period, the potentials of the m first word lines are set at the L level, the potential of the second word line to which the non-selected memory cell is electrically connected is set at the H level, the potential of the second word line to which the selected memory cell is electrically connected is set at the L level, and then the potential of the source line is set at the L level; thus, the first transistor is maintained in an off state and the potential of the bit line to which the selected memory cell is electrically connected is maintained at the M level, so that data "1" is read in the case where the potential held in the node of the selected memory cell is at the H level, and the first transistor is turned on and the potential of the bit line to which the selected memory cell is electrically connected is reduced to the L level, so that data "0" is read in the case where the potential held in the node of the selected memory cell is at the L level.

In the above method for driving a semiconductor device, a channel formation region of the second transistor is preferably formed using an oxide semiconductor. Further, the first transistor is preferably a p-channel transistor.

In the above, data "1" and data "0" can be replaced with each other.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Thus, the terms "source" and "drain" can be replaced with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

With one embodiment of the present invention, a semiconductor device which can hold data even when not powered and has an unlimited number of write cycles can be driven.

Further, a potential of data written to the semiconductor device is not inverted and is read from the semiconductor device as it is, so that a logic inverter circuit is not needed. Thus, the scale of a circuit can be reduced.

Since the logic inverter circuit is not needed, power consumption can be reduced.

In addition, delay due to the circuit is eliminated because the logic inverter circuit is not needed, and a bit line is not necessarily precharged at the time of reading; thus, the speed of reading data can be increased.

DETAILED DESCRIPTION OF THE INVENTION

Figure 1A:
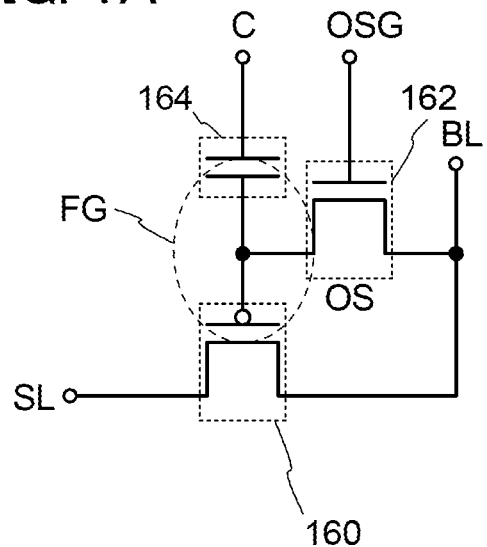
FIGS. 1A and 1B are each a circuit diagram of a semiconductor device.

Hereinafter, embodiments of the present invention will be described with reference to the drawings. Note that the present invention is not limited to the following description and it will be readily appreciated by those skilled in the art that the modes and details of the present invention can be modified in various ways without departing from the spirit and scope thereof. Thus, the invention should not be construed as being limited to the descriptions of the embodiments below.

Note that the position, size, range, and the like of each component illustrated in the drawings and the like are not accurately represented for easy understanding in some cases. Thus, the disclosed invention is not necessarily limited to the position, size, range, and the like in the drawings and the like.

In this specification and the like, ordinal numbers such as "first", "second", and "third" are used in order to avoid confusion among components, and the terms do not limit the components numerically.

Embodiment 1

In this embodiment, a basic circuit structure of a semiconductor device relating to one embodiment of the disclosed invention and its operation will be described with reference to FIGS. 1A and 1B and FIGS. 2A and 2B. Note that in each of circuit diagrams, in some cases, "OS" is written beside a transistor in order to indicate that the transistor includes an oxide semiconductor.
<Basic Circuit 1>

First, the most basic circuit configuration of a semiconductor device relating to one embodiment of the present invention and its operation will be described with reference to FIGS. 1A and 1B.

In a semiconductor device illustrated in FIG. 1A, a bit line BL, a source electrode (or a drain electrode) of a transistor 160, and a source electrode (or a drain electrode) of a transistor 162 are electrically connected; and a source line SL is electrically connected to the drain electrode (or the source electrode) of the transistor 160. A first word line OSG is electrically connected to a gate electrode of the transistor 162. A gate electrode of the transistor 160, the drain electrode (or the source electrode) of the transistor 162, and one electrode of a capacitor 164 are electrically connected. A second word line C is electrically connected to the other electrode of the capacitor 164. Note that the source electrode (or the drain electrode) of the transistor 160 and the source electrode (or the drain electrode) of the transistor 162 may be connected to different wirings without being electrically connected to each other.

Here, the transistor 160 functions as a writing and reading transistor and the transistor 162 functions as a writing transistor.

As the transistor 162, a transistor in which a channel formation region is formed using an oxide semiconductor can be used, for example. Such a transistor has a characteristic of a significantly small off-state current. For that reason, a potential of the gate electrode of the transistor 160 can be held for an extremely long time by turning off the transistor 162. Since the capacitor 164 is connected, holding of charge applied to the gate electrode of the transistor 160 and reading of held data can be facilitated.

Note that there is no particular limitation on a semiconductor material used for the transistor 160. In terms of increasing the speed of reading data, it is preferable to use, for example, a transistor with high switching rate such as a transistor in which a channel formation region is formed using single crystal silicon. In the present invention, a p-channel transistor is used as the transistor 160.

The semiconductor device in FIG. 1A utilizes a characteristic in which the potential of the gate electrode of the transistor 160 can be held, and thus enables data writing, holding, and reading as follows.

First, a first driving method in which two kinds of charges providing different potentials (hereinafter, a charge providing a low potential (L level) is referred to as a charge $Q_L$ and a charge providing a high potential (H level) is referred to as a charge $Q_H$) are used is described. Note that three or more kinds of charges providing different potentials can be used, in other words, a multivalued technique can be employed, to increase storage capacity. The multivalued technique can be applied not only to the first driving method but also to a second driving method described later.

Figure 14:
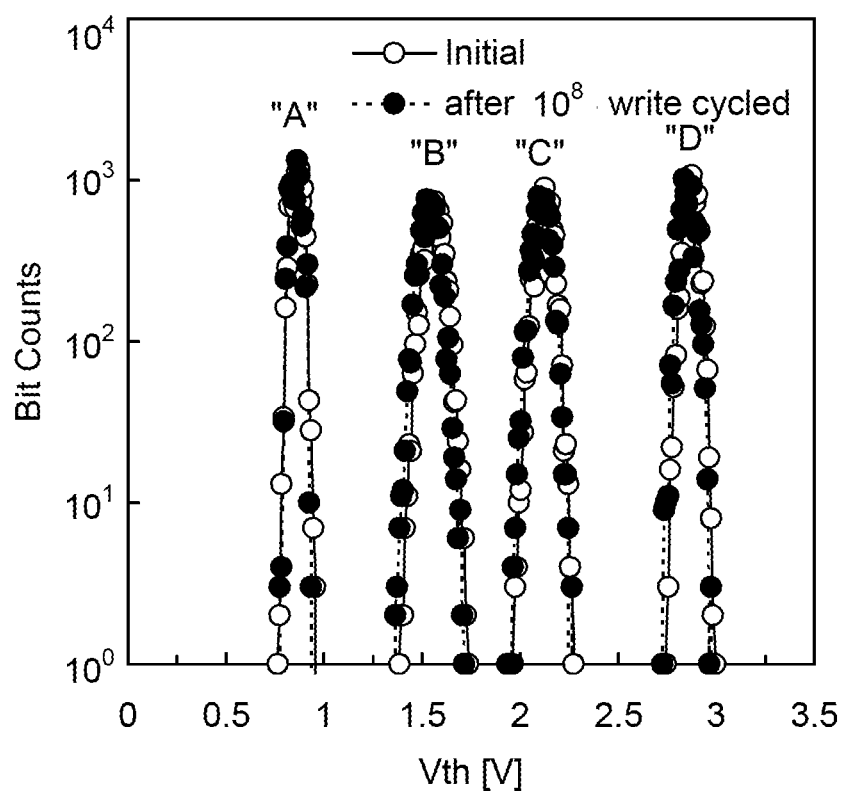
FIG. 14 is a graph showing distribution of the threshold voltages of a semiconductor device.

For example, FIG. 14 shows the distribution of the apparent threshold voltages ($V_{th}$) of the transistor 160 in the case where writing is performed on the semiconductor device illustrated in FIG. 1A with the use of four potentials. Potentials of 0 V, 1.6 V, 2.1 V, and 3 V are used for writing data A, data B, data C, and data D, respectively. In FIG. 14, the initial distribution and the distribution after $10^8$ times of rewriting are shown. Table 1 shows the average values ($\mu$) and the standard deviations ($3\sigma$) of the distributions of the threshold voltages in the case where the respective data are written. FIG. 14 and Table 1 indicate that distributions of the threshold voltages in the case where the respective data are written each have a sharp peak.

TABLE 1

|   | Initial | | After $10^8$ cycled | |
|---|---|---|---|---|
|   | μ [V] | 3σ [mV] | μ [V] | 3σ [mV] |
| A | 0.863 | 85.8 | 0.857 | 83.2 |
| B | 1.56 | 142 | 1.54 | 144 |
| C | 2.13 | 126 | 2.11 | 131 |
| D | 2.87 | 106 | 2.85 | 109 |

Figure 15:
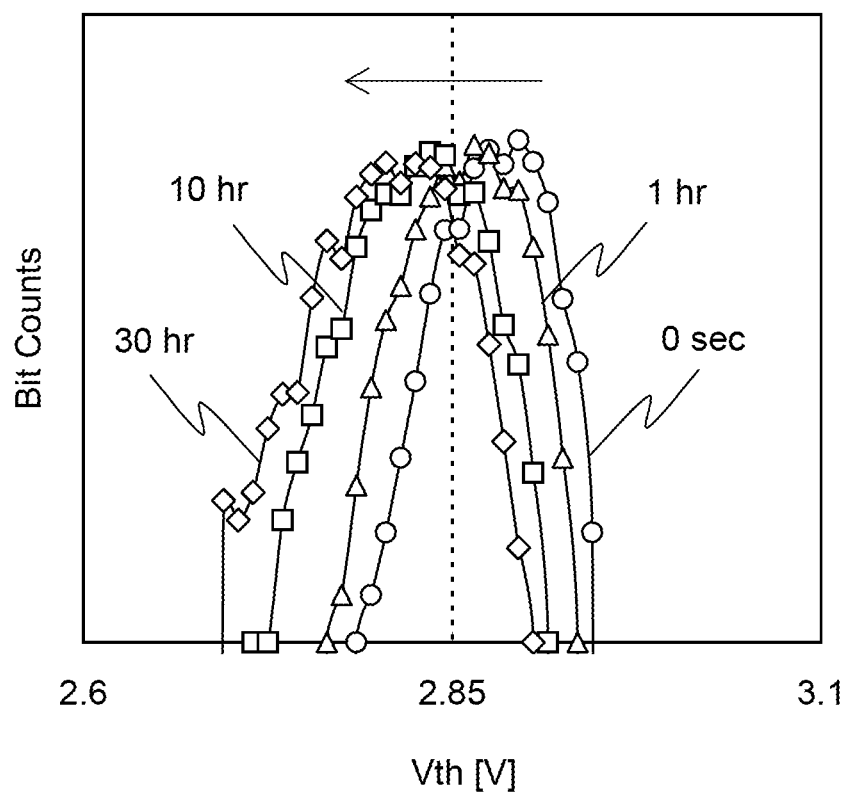
FIG. 15 is a graph showing retention characteristics of a semiconductor device.
Figure 16:
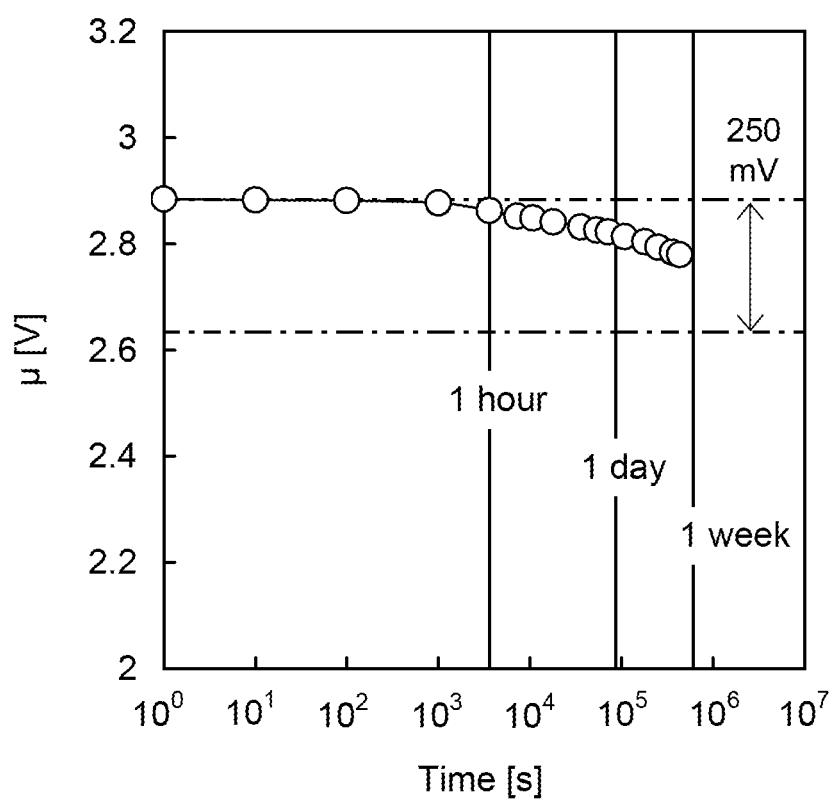
FIG. 16 is a graph showing retention characteristics of a semiconductor device.

FIG. 15 and FIG. 16 each show the retention characteristics of the semiconductor device illustrated in FIG. 1A at 85° C. of the case where data D is written. FIG. 15 is a graph in which variations in the distribution of $V_{th}$ from 0 seconds to 30 hours are superposed and plotted. FIG. 16 shows time dependence of the average value ($\mu$) of the distribution of $V_{th}$. The average value of the distribution of $V_{th}$ measured after 50 hours shifts by approximately 80 mV; thus, it can be estimated that data can be held for about 11 days even at 85° C. in the case where the allowable range in data is 250 mV.

Note that in the first driving method, the source line SL and the bit line BL are at L level in a standby period.

First, in a writing period, the potential of the first word line OSG is set to a potential which allows the transistor 162 to be turned on while an H level or L level potential is applied to the bit line BL, so that the transistor 162 is turned on. Accordingly, the potential of the bit line BL is applied to a node (also referred to as a node FG) where the drain electrode (or the source electrode) of the transistor 162, the gate electrode of the transistor 160, and one electrode of the capacitor 164 are electrically connected. In other words, predetermined charge is applied to the node FG, so that data writing is completed.

After that, the potential of the first word line OSG is set to a potential which allows the transistor 162 to be turned off, so that the transistor 162 is turned off. Thus, the charge applied to the node FG is held. Since the off-state current of the transistor 162 is significantly small, the charge of the gate electrode of the transistor 160 is held for a long time.

Data is read as follows. When an appropriate potential (reading potential) is applied to the second word line C while a predetermined potential (constant potential) is applied to the source line SL, the potential the bit line BL varies depending on the amount of charge held in the node FG. In other words, the conductance of the transistor 160 is controlled by the charge held in the gate electrode of the transistor 160 (which can also be referred to as the node FG).

In general, when the transistor 160 is a p-channel transistor, an apparent threshold voltage $V_{th\_H}$ in the case where $Q_H$ is applied to the gate electrode of the transistor 160 is lower than an apparent threshold voltage $V_{th\_L}$ in the case where $Q_L$ is applied to the gate electrode of the transistor 160. For example, in the case where $Q_L$ is applied to the gate electrode of the transistor 160 in writing, when the potential of the second word line C is $V_0$ (a potential intermediate between $V_{th\_H}$ and $V_{th\_L}$), the transistor 160 is turned on. In the case where $Q_H$ is applied to the gate electrode of the transistor 160 in writing, even when the potential of the second word line C is $V_0$, the transistor 160 remains off. Thus, the held data can be read out by detecting the potential of the bit line BL.

In the first driving method described above, data (voltage level) a logic of which is obtained by inverting data (voltage level) written to a semiconductor device is read from the semiconductor device. For example, when data "1" (H level) is written, data "0" (L level) is read out. Thus, a logic inverter circuit (e.g., an inverter) is necessarily connected to the semiconductor device to invert the inverted logic of the data (voltage) again.

In one embodiment of the present invention, data can be written, held, and read in a method different from the first driving method. In the second driving method, L level, H level, and M level (level intermediate between an L level and an H level) potentials are used to drive a semiconductor device.

In the second driving method, the source line SL and the bit line BL are precharged with a potential at a level intermediate between an L level and an H level (M level) in a standby period. Note that a potential at an M level is not limited to a potential at a level at the midpoint between an L level and an H level, and may be at any level as long as the level satisfies L level<M level<H level.

First, the potential of the first word line OSG is set to a potential which allows the transistor 162 to be turned on while an L level potential is applied to the source line SL and an H level or L level potential is applied to the bit line BL, so that the transistor 162 is turned on. Accordingly, the potential of the bit line BL is applied to the node FG where the drain electrode (or the source electrode) of the transistor 162, the gate electrode of the transistor 160, and one electrode of the capacitor 164 are electrically connected; thus, data writing is completed.

After that, the potential of the first word line OSG is set to a potential which allows the transistor 162 to be turned off, so that the transistor 162 is turned off. Thus, the charge applied to the node FG is held. Since the off-state current of the transistor 162 is significantly small, the charge of the gate electrode of the transistor 160 is held for a long time.

Data is read as follows. When an appropriate potential (reading potential) is applied to the second word line C while an L level potential is applied to the source line SL, the potential of the bit line BL is set to at an M level or an L level depending on the amount of charge held in the node FG. The written data can be read out by detecting this potential.

Then, rewriting of data will be described. In the first driving method and the second driving method, data is rewritten in a manner similar to the method of the writing and holding of data in respective driving methods. In other words, the potential of the first word line OSG is set to a potential which allows the transistor 162 to be turned on, whereby the transistor 162 is turned on. Accordingly, the potential of the bit line BL (potential for new data) is applied to the node FG. After that, the potential of the first word line OSG is set to a potential which allows the transistor 162 to be turned off, whereby the transistor 162 is turned off. Accordingly, charge for new data is held in the node FG.

In the semiconductor device, data can be directly rewritten by another writing of data as described above. For this reason, extracting of charge from a floating gate with the use of a high voltage which is needed in a flash memory or the like is not necessary and thus, reduction in operation speed, which is attributed to erasing operation, can be suppressed. In other words, erasing operation is not needed, so that high-speed operation of the semiconductor device can be obtained.

Further, unlike in the first driving method, written data "0" (L level) can be read as it is, i.e., as data "0" (L level), when the second driving method is used; a logic inverter circuit (e.g., an inverter) is not needed and the scale of a circuit can be reduced. Since the logic inverter circuit is not needed, power consumption can be reduced. In addition, delay due to the circuit is eliminated and a bit line is not necessarily precharged at the time of reading; thus, the speed of reading data can be increased.

Writing, holding, and reading of data, for example, in the case where either a power supply potential $V_{DD}$ (H level) or a ground potential GND (L level) is applied to the node FG by the second driving method will be specifically described below. In the description below, data that is held when $V_{DD}$ is supplied to the node FG is referred to as data "1", and data that is held when GND is supplied to the node FG is referred to as data "0". Note that the relation between potentials supplied to the node FG is not limited to this example. Note that data "1" and data "0" can be replaced with each other.

First, in an initial state (standby period), the source line SL and the bit line BL are precharged with a potential $V_{SL}$ (M level) which is intermediate between $V_{DD}$ and GND. For example, when $V_{DD}$ is 3 V and GND is 0 V, $V_{SL}$ is 1.5 V.

In the case where data is written (in a writing period), the source line SL is set to GND, the second word line C is set to GND, and the first word line OSG is set to $V_{DD}$, so that the transistor 162 is turned on. Then, in the case where data "0" is written to the node FG, GND is applied to the bit line BL. In the case where data "1" is written to the node FG, the potential of the bit line BL is preferably set to $V_{DD}$, and the potential of the first word line OSG is preferably set to $(V_{DD}+V_{th\_OS})$ to prevent a drop in the voltage by the threshold voltage of the transistor 162 $(V_{th\_OS})$.

In the case where data is held (in a holding period) or a memory cell is brought into a standby state (in a standby period), the first word line OSG is set to GND, so that the transistor 162 is turned off. Note that in the case where the threshold voltage of the transistor 162 is negative, the potential of the first word line OSG is set to be negative so that the transistor 162 is turned off.

In the standby period and the holding period, the second word line C is set to $V_{DD}$ and the bit line BL and the source line SL are set to the same potential (here, $V_{SL}$), so that leakage current of the transistor 160 can be reduced, which results in a reduction in power consumption.

It is preferable to set the bit line BL and the source line SL to the same potential in the standby period and the holding period to improve reliability because voltage stress on the transistor 162 can be suppressed.

Note that in this specification, "the same potential" includes "substantially the same potential". That is, the purpose of the above operation lies in that the voltage between the bit line BL and the source line SL is sufficiently reduced to reduce current flowing between the bit line BL and the source line SL; thus, "the same potential" includes "substantially the same potential", for example, a potential which allows power consumption to be sufficiently reduced (to less than or equal to one hundredth, for example) as compared with the case where the potential of the source line SL is fixed to GND or the like. In addition, for example, potential deviation due to wiring resistance or the like is reasonably acceptable.

In the case where the data is read out (in a reading period), the first word line OSG is set to GND, the second word line C is set to GND, and the source line SL is set to GND. Here, in the case where data "1" has been written to the node FG the p-channel transistor 160 is turned off, and the potential of the bit line BL is maintained at the level of the beginning of reading. Further, in the case where data "0" has been written to the node FG, the transistor 160 is turned on, and the potential of the bit line BL reduces. Thus, data "1" or data "0" held in the node FG can be read out by detecting the potential of the bit line BL.

Here, the node (node FG) where the drain electrode (or the source electrode) of the transistor 162, the gate electrode of the transistor 160, and one electrode of the capacitor 164 are electrically connected has a function similar to that of a floating gate of a floating-gate transistor used for a nonvolatile memory element. When the transistor 162 is off, the node FG can be regarded as being embedded in an insulator and charge is held in the node FG. The off-state current of the transistor 162 including an oxide semiconductor is smaller than or equal to one hundred thousandth of the off-state current of a transistor including a silicon semiconductor or the like; thus, loss of the charge accumulated in the node FG due to leakage current of the transistor 162 is negligible. In other words, with the transistor 162 including an oxide semiconductor, a nonvolatile memory device which can hold data without being supplied with power can be fabricated.

When the off current of the transistor 162 is 10 zA (1 zA (zeptoampere) is $1 \times 10^{-21}$ A) or less at room temperature (25° C.) and the capacitance value of the capacitor 164 is approximately 10 fF, for example, data can be held for $10^4$ seconds or longer. It is needless to say that the holding time depends on transistor characteristics and the capacitance value.

In the semiconductor device of this embodiment, a problem of deterioration of a gate insulating film (tunnel insulating film), which occurs in a conventional floating gate transistor, does not exist. That is, the deterioration of a gate insulating film due to injection of electrons into a floating gate, which has been traditionally regarded as a problem, can be solved. This means that there is no limitation on the number of times of writing operations in principle. Further, high voltage needed for writing or erasing data in a conventional floating gate transistor is not necessary.

Figure 1B:
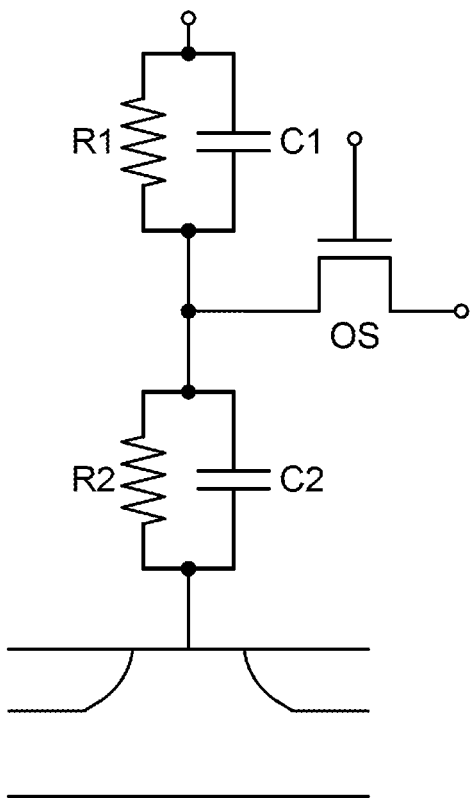

Components such as transistors in the semiconductor device in FIG. 1A can be regarded as including resistors and capacitors as illustrated in FIG. 1B. In other words, in FIG. 1B, the transistor 160 and the capacitor 164 are each regarded as including a resistor and a capacitor. Note that R1 and C1 denote the resistance value and the capacitance value of the capacitor 164, respectively. The resistance value R1 corresponds to the resistance value of an insulating layer included in the capacitor 164. Further, R2 and C2 denote the resistance value and the capacitance value of the transistor 160, respectively. The resistance value R2 corresponds to the resistance value of a gate insulating layer at the time when the transistor 160 is turned on. The capacitance value C2 corresponds to gate capacitance (capacitance formed between the gate electrode and the source electrode or the drain electrode, or capacitance formed between the gate electrode and the channel formation region).

A charge holding period (also referred to as a data holding period) is determined mainly by the off-state current of the transistor 162 under the conditions where the gate leakage current of the transistor 162 is sufficiently small and R1 and R2 satisfy R1≥ROS (R1 is greater than or equal to ROS) and R2≥ROS (R2 is greater than or equal to ROS), where ROS is the resistance value (also referred to as effective resistance) between the source electrode and the drain electrode in a state where the transistor 162 is turned off.

On the other hand, in the case where the conditions are not satisfied, it is difficult to secure a sufficient holding period even if the off-state current of the transistor 162 is sufficiently small. This is because leakage current other than the off-state current of the transistor 162 (e.g., leakage current generated between the source electrode and the gate electrode) is large. Accordingly, it can be said that it is preferable that the semiconductor device disclosed in this embodiment satisfies the above relations of R1≥ROS and R2≥ROS.

Meanwhile, it is desirable that C1 and C2 satisfy C1≥C2 (C1 is greater than or equal to C2). This is because if C1 is large, the potential of the second word line C can be efficiently applied to the node FG when the potential of the node FG is controlled by the second word line C and the difference between potentials applied to the second word line C (e.g., a reading potential and a non-reading potential) can be kept small.

As described above, when the above relations are satisfied, a more favorable semiconductor device can be fabricated. Note that R1 and R2 are controlled by the gate insulating layer of the transistor 160 and the insulating layer of the capacitor 164. The same applies to C1 and C2. Thus, the material, the thickness, and the like of the gate insulating layer are desirably set as appropriate to satisfy the above relations.

In the semiconductor device described in this embodiment, the node FG has an effect similar to a floating gate of a floating-gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells to prevent the potential from affecting a floating gate of the adjacent cell. This is one of inhibiting factors for high integration of the semiconductor device. The factor is attributed to a basic principle of a flash memory, in which tunneling current flows is generated by application of a high electrical field.

In contrast, the semiconductor device of this embodiment utilizes switching of a transistor including an oxide semiconductor and does not use the above-described principle of charge injection by tunneling current. In other words, a high electric field for charge injection is not necessary unlike in a flash memory. Accordingly, it is not necessary to consider an influence of a high electric field from a control gate on an adjacent cell, which facilitates high integration.

In addition, the semiconductor device of this embodiment is advantageous over a flash memory in that a high electric field is not necessary and a large peripheral circuit (such as a booster circuit) is not necessary. For example, the highest voltage applied to the memory cell of this embodiment (the difference between the highest potential and the lowest potential applied to terminals of the memory cell at the same time) can be 5 V or lower, preferably 3 V or lower in each memory cell in the case where two levels (one bit) of data are written.

In the case where the dielectric constant $\epsilon r1$ of the insulating layer included in the capacitor 164 is different from the dielectric constant $\epsilon r2$ of the insulating layer included in the transistor 160, it is easy to satisfy C1≥C2 (C1 is greater than or equal to C2) while 2·S2≥S1 (2·S2 is greater than or equal to S1), desirably S2≥S1 (S2 is greater than or equal to S1) is satisfied where S1 is the area of the insulating layer included in the capacitor 164 and S2 is the area of an insulating layer forming gate capacitance of the transistor 160. In other words, it is easy to satisfy C1≥C2 while the area of the insulating layer included in the capacitor 164 is made small. Specifically, for example, a film formed of a high-k material such as hafnium oxide or a stack of a film formed of a high-k material such as hafnium oxide and a film formed of an oxide semiconductor is used for the insulating layer included in the capacitor 164 so that $\epsilon r1$ can be set to 10 or more, preferably 15 or more; and silicon oxide is used for the insulating layer forming the gate capacitance of the transistor 160 so that $\epsilon r2$ can be set to 3 to 4.

Combination of such structures enables higher integration of the semiconductor device relating to one embodiment of the disclosed invention.

<Basic Circuit 2>

Figure 2A:
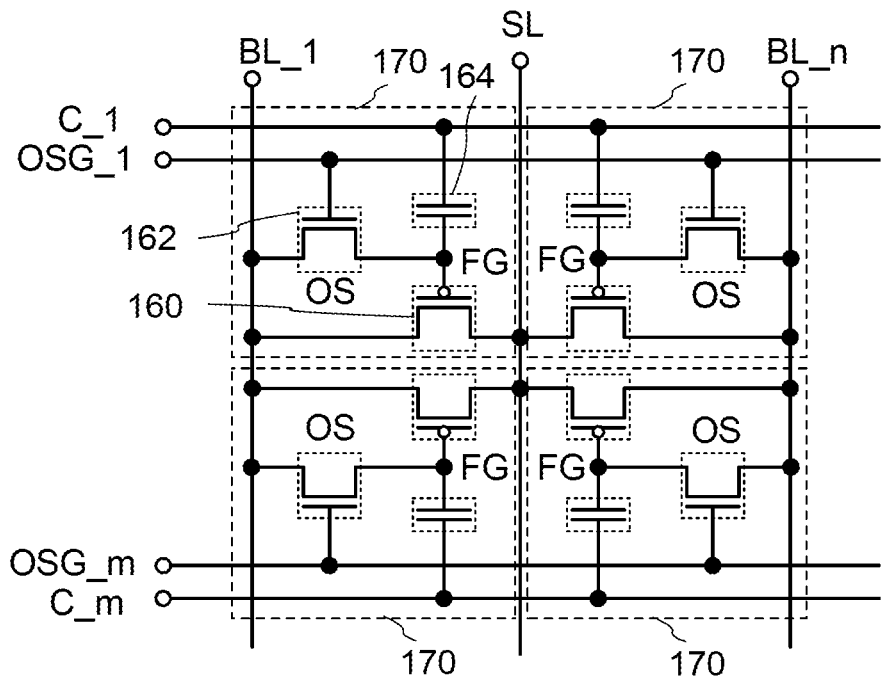
FIGS. 2A and 2B are each a circuit diagram of a semiconductor device.
Figure 2B:
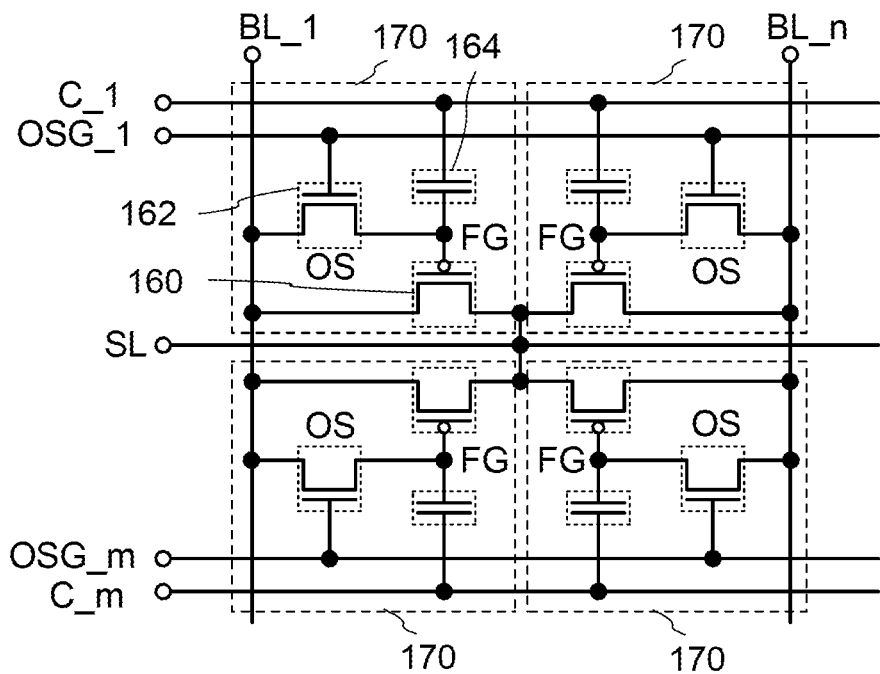

FIGS. 2A and 2B are circuit diagrams of memory cell arrays in each of which the memory cells illustrated in FIG. 1A are arranged in a matrix with two rows and two columns. The structures of memory cells 170 in FIGS. 2A and 2B are similar to that in FIG. 1A. Note that the memory cells in two columns share the source line SL in FIG. 2A, and the memory cells in two rows share the source line SL in FIG. 2B.

When memory cells 170 in two columns or two rows share the source line SL as in FIG. 2A or 2B, the number of signal lines connected to the memory cells 170 can be reduced to 3.5 (3+½) from 4 that is the number of signal lines in the case where the source line SL is not shared.

Note that without limitation to two columns (or two rows), plural columns (or plural rows) such as three or more columns (or three or more rows) may share the source line SL. The number of columns (or rows) which share the source line SL may be determined as appropriate in consideration of parasitic resistance and parasitic capacitance generated when the source line SL is shared. Further, to reduce the number of signal lines connected to the memory cells 170, the number of columns (or rows) which share the source line SL is preferably large.

In the semiconductor devices illustrated in FIGS. 2A and 2B, writing, holding, and reading of data are performed similarly to the case of FIGS. 1A and 1B; thus, the above description can be referred to. For example, writing operation using the second driving method, in the case where either $V_{DD}$ (H level) or GND (L level) is applied to the node FG and in the case where data held at the time when $V_{DD}$ is applied to the node FG is data "1" and data held at the time when GND is applied to the node FG is data "0" will be specifically described below.

First, in a standby period, all first word lines OSG, all second word lines C, all bit lines BL, and the source line SL that are connected to the memory cells 170 are set to GND, $V_{DD}$, $V_{SL}$ (M level), and $V_{SL}$ (M level), respectively.

Next, the second word line C and the first word line OSG which are connected to a selected memory cell are set to GND and $V_{DD}$, respectively. Then, the bit line BL which is connected to the selected memory cell is set to $V_{DD}$ or GND, the source line SL is set to GND, and the potential of the bit line BL is supplied to the node FG of the selected memory cell 170, whereby data is written. Since the potential of the second word line C which is not connected to the selected memory cell is not changed from $V_{DD}$ at this time, a charge and discharge time is not necessarily set; thus, the operation speed of writing can be increased.

Then, the second word lines C are set to $V_{DD}$, the first word lines OSG are set to GND, the bit lines BL are set to $V_{SL}$, and the source line SL is set to $V_{SL}$, so that data is held. When the second word lines C are set to $V_{DD}$, the potential of the node FG is increased, so that the p-channel transistor 160 is turned off. In addition, since the bit line BL and the source line SL are set to the same potential, the source-drain voltage of the transistor 160 ($V_{ds\_p}$) is 0 V, which results in a reduction in leakage current. Such operation allows the retention characteristics of the memory cell 170 to be further improved.

In the case where the memory cells 170 are arrayed as in FIGS. 2A and 2B, it is necessary to read out data only from the intended memory cell 170 in the reading period. To read out data only from the predetermined memory cell 170 and not to read out data from the other memory cells 170 as described above, the memory cells 170 from which data is not read out need to be in a non-selected state.

For example, as described in Basic Circuit 1, in the case where either $V_{DD}$ or GND is applied to the node FG and in the case where data held at the time when $V_{DD}$ is applied to the node FG is data "1" and data held at the time when GND is applied to the node FG is data "0", the second word line C is set to $V_{DD}$ and the first word line OSG is set to GND, so that the memory cell 170 can be brought into a non-selected state.

When the second word line C is set to $V_{DD}$, the potential of the node FG is increased owing to capacitive coupling with the capacitor 164. In the case where the capacitance of the capacitor 164 is sufficiently larger than the gate capacitance of the transistor 160 and $V_{DD}$ that is data "1" has been written to the node FG, the potential of the node FG is increased by $V_{DD}$ to be $2V_{DD}$ ($=V_{DD}+V_{DD}$). In contrast, in the case where GND that is data "0" has been written to the node FG the potential of the node FG is increased by $V_{DD}$ to be $V_{DD}$ ($=GND+V_{DD}$). That is, the gate-source voltage of the transistor 160 ($V_{gs\_p}$) is larger than the threshold voltage of the transistor ($V_{th\_p}$) in either case; thus, the transistor 160 which is a p-channel transistor is turned off. In other words, by setting the second word line C to $V_{DD}$, the transistor 160 can be turned off, that is, the memory cell 170 can be brought into a non-selected state regardless of the data held in the node FG.

Note that if n-channel transistors are used as the transistors 160 for reading, in the case where the potentials of the gate electrodes of the n-channel transistors are higher than the threshold voltage of the transistors, not all memory cells can be turned off even by setting the second word line C to 0 V. Thus, a negative potential needs to be supplied to the second word line C and the first word line OSG in a non-selected row to bring the memory cells into a non-selected state. In contrast, in the semiconductor device described in this embodiment, p-channel transistors are used as the transistors for reading. Thus, memory cells in a non-selected row can be turned off by setting the second word line C in a non-selected row to a positive potential. Accordingly, a circuit generating a negative potential does not need to be provided for the memory cell. As a result, power consumption can be reduced and the semiconductor device can be downsized.

Figure 3:
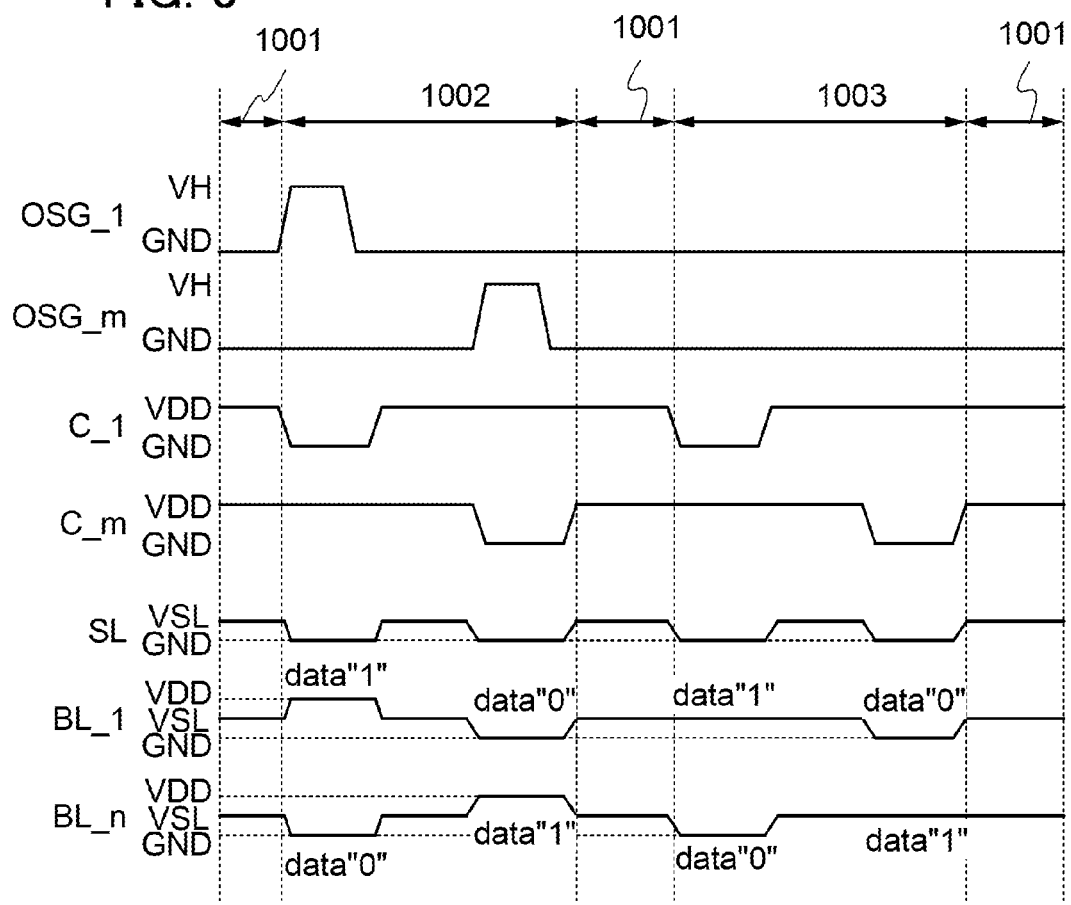
FIG. 3 is a timing chart.

FIG. 3 is an example of a timing chart for the writing, holding, and reading operations of the semiconductor device in FIGS. 2A and 2B. Names such as OSG, C, and the like in the timing chart denote the wirings to which the potentials in the timing chart are applied. Wirings having a similar function are distinguished by "_1", "_m", "_n" and the like added to the end of their names. Note that the semiconductor device relating to one embodiment of the present invention is not limited to the arrangement described below.

FIG. 3 shows the relation among the potentials of the wirings in the semiconductor device includes (m×n) memory cells (m and n are each an integer of greater than or equal to 2) in the case where data "1" is written to the memory cell at the first row and first column, data "0" is written to the memory cell at the first row and n-th column, data "0" is written to the memory cell at the m-th row and first column, and data "1" is written to the memory cell at the m-th row and n-th column in the memory cells in m rows and n columns, and then all the data that is written is read out after the holding period.

In standby and holding periods 1001, the first word line OSG is set to GND and the second word line C is set to $V_{DD}$. In addition, all the bit lines BL and the source line SL are set to the same potential. In FIG. 3, OSG_1 and OSG_m are set to GND; C_1 and C_m are set to $V_{DD}$; and SL, BL_1, and BL_n are set to $V_{SL}$.

In a writing period 1002, a row on which writing is performed is selected as follows: the first word line OSG in a row to be selected is set to a potential ($V_H$) that is higher than a power supply potential ($V_{DD}$) and the second word line C in the row to be selected is set to GND, and then the first word line OSG in a non-selected row is set to GND and the second word line C in the non-selected row is set to $V_{DD}$. In FIG. 3, OSG_1 is set to $V_H$ and C_1 is set to GND, so that the first row is selected.

To prevent a potential written to the node FG of the memory cell 170 from being decreased by the threshold voltage of the transistor 162 ($V_{th\_OS}$), the potential of the first word line OSG needs to be set higher than the sum of the potential of the bit line BL and $V_{th\_OS}$. Thus, for example, when $V_{DD}$ is written to the node FG (that is, when data "1" is written), $V_H$ is set higher than or equal to ($V_{DD}V_{th\_OS}$). Note that if no problem arises even when the potential written to the node FG is decreased by $V_{th\_OS}$, $V_H$ may be set to a potential equal to $V_{DD}$.

Then, data is input from the bit line BL to the memory cell. For example, when data "1" is written, $V_{DD}$ is supplied to the bit line BL; when data "0" is written, GND is input to the bit line BL. In FIG. 3, BL_1 is set to $V_{DD}$ and BL_n is set to GND.

Next, in all the rows, the first word lines OSG are set to GND; then, at a timing later than that, the second word lines C are set to $V_{DD}$ and the source line SL and the bit lines BL are set to $V_{SL}$. This is because when the potentials of the bit lines BL change at a timing earlier than the timing when the first word lines OSG are set to GND, incorrect writing of data to the memory cell might be caused. In FIG. 3, OSG_1 is set to GND, and then C1 is set to $V_{DD}$ and SL, BL_1, and BL_n are set to $V_{SL}$. In this manner, data "1" and data "0" can be written to the memory cell at the first row and first column and the memory cell at the first row and n-th column, respectively.

Note that the second word lines C are set to $V_{DD}$ preferably at a timing earlier than the timing when the bit lines BL and the source line SL are set to $V_{SL}$. This is because in the case where the second word lines C are set to $V_{DD}$ at a timing later than the timing when the bit lines BL and the source line SL are set to $V_{SL}$, current flows between the drain and the source of the transistor 160 in some cases.

After that, the m-th row is selected referring to the above description, and BL_1 is set to GND and BL_n is set to $V_{DD}$. As a result, data "0" can be written to the memory cell at the m-th row and first column, and data "1" can be written to the memory cell at the m-th row and n-th row.

In the case where GND is applied to the node FG in the writing period 1002, the potential of the source line SL is set to GND in order that current flowing in the bit line BL and the source line SL may be suppressed.

In a reading period 1003, first, the second word line C in a row to be selected is set to GND, and the second word line C in a non-selected row is set to $V_{DD}$, so that a row on which reading is performed is selected. The first line OSG is set to GND regardless of a selected state or a non-selected state. In FIG. 3, C_1 is set to GND and C_m is set to $V_{DD}$ to select the first row.

Next, the source line SL is set to GND, so that the potential of BL_1 is held at $V_{SL}$. Thus, data "1" can be read from the memory cell at the first row and first column. Further, the potential of BL_n is held at GND, so that data "0" can be read from the memory cell at the first row and n-th column.

Then, the m-th row is selected and operation referring to the above description is performed, so that data "0" and data "1" can be read from the memory cell at the m-th row and first column and the memory cell at the m-th row and n-th column, respectively.

As described above, in the semiconductor devices having the circuit configurations illustrated in FIGS. 2A and 2B, the area of the memory cell array can be reduced by sharing the source line SL with plural columns (or plural rows). Accordingly, the die size can be reduced. Moreover, the reduction in the die size allows cost reduction in manufacturing the semiconductor device and improvement in yield.

Application Example 1

Next, a more specific circuit configuration to which the circuit illustrated in FIG. 1A or 1B is applied will be described with reference to FIG. 4 and FIGS. 5A to 5D. Note that the case where an n-channel transistor is used as a writing transistor (the transistor 162) and a p-channel transistor is used as a reading transistor (the transistor 160) will be described below as an example. In the circuit diagram illustrated in FIG. 4, wirings with slashes are wirings each including a plurality of signal lines.

Figure 4:
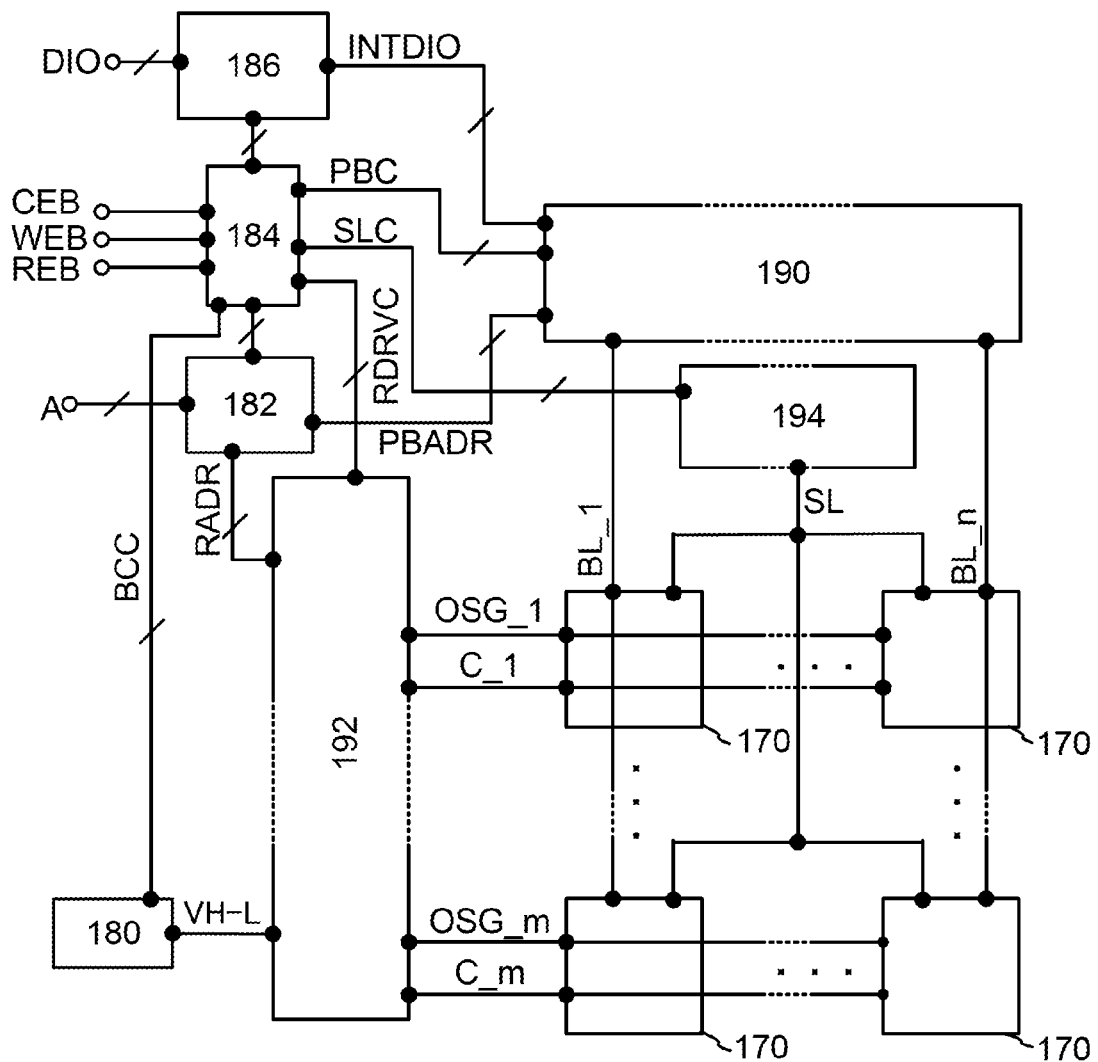
FIG. 4 is a circuit diagram of a semiconductor device.

FIG. 4 is an example of a circuit diagram of a semiconductor device including (m×n) memory cells 170. The configuration of the memory cells 170 in FIG. 4 is similar to that in FIG. 1A.

The semiconductor device illustrated in FIG. 4 includes m (m is an integer greater than or equal to 2) first word lines OSG, m second word lines C, n (n is an integer greater than or equal to 2) bit lines BL, k (k is an integer of 1 or more) source lines SL, a memory cell array having the memory cells 170 arranged in a matrix with m (rows)×n (columns), a step-up circuit 180, a first driver circuit 182 including an address decoder, a second driver circuit 192 including a row driver, a third driver circuit 190 including a page buffer, a fourth driver circuit 184 including a controller, a fifth driver circuit 186 including an input-output control circuit, and a source line switching circuit 194. The driver circuit is not limited to that in FIG. 4. Driver circuits having various functions may be combined. Alternatively, functions of each driver circuit may be separated for other driver circuits.

In the semiconductor device illustrated in FIG. 4, the first driver circuit 182 includes an address decoder. The address decoder is a circuit which decodes an address selection signal line A and outputs the decoded address selection signal to a row selection signal line RADR and a page buffer address selection signal line PBADR. The address selection signal line A corresponds to a terminal to which a row address selection signal of the memory cells 170 and a page buffer address selection signal are input. One or more address selection signal lines A are provided depending on the numbers of columns and rows of the memory cells 170 or the structure of the page buffer. The row selection signal line RADR is a signal line which specifies the row address of memory cells. The page buffer address selection signal line PBADR is a signal line which specifies the page buffer address.

The second driver circuit 192 includes a row driver. The row driver outputs a row selection signal of the memory cells 170, a signal to the first word line OSG, and a signal to the second word line C on the basis of a signal output to the row selection signal line RADR from the address decoder included in the first driver circuit 182.

The step-up circuit 180 is connected to the second driver circuit 192 through a wiring VH-L and is configured to step up a constant potential (e.g., a power supply potential $V_{DD}$) which is input to the step-up circuit 180 and to output a potential ($V_H$) higher than the constant potential to the second driver circuit 192. To prevent a potential written to the node FG of the memory cell 170 from being decreased by the threshold voltage of the transistor 162 ($V_{th\_OS}$) that is a writing transistor, the potential of the first word line OSG needs to be set higher than the sum of the potential of the bit line BL and $V_{th\_OS}$. Thus, for example, when the power supply potential $V_{DD}$ is written to the node FG, $V_H$ is set higher than or equal to ($V_{DD}+V_{th\_OS}$). Note that if a decrease in the potential written to the node FG by $V_{th\_OS}$ does not cause any problem, the step-up circuit 180 is not necessarily provided.

The third driver circuit 190 includes a page buffer. The page buffer functions as both a data latch and a sense amplifier. The page buffer functions as a data latch as follows: the page buffer temporarily holds data output from an internal data input-output signal line INTDIO or the bit line BL and outputs the held data to the internal data input-output signal line INTDIO or the bit line BL. The page buffer functions as a sense amplifier as follows: the page buffer senses the bit line BL to which data is output from the memory cell when data is read.

The fourth driver circuit 184 is a circuit which includes a controller and generates signals for controlling the first driver circuit 182, the second driver circuit 192, the third driver circuit 190, the fifth driver circuit 186, the source line switching circuit 194, and the step-up circuit 180, with a signal from a chip-enable bar signal line CEB, a write-enable bar signal line WEB, or a read-enable bar signal line REB.

The chip-enable bar signal line CEB is a signal line for outputting a selection signal for the entire circuit, and accepts an input signal and outputs an output signal only when it is active. The write-enable bar signal line WEB is a signal line for outputting a signal which allows latch data of the page buffer in the third driver circuit 190 to be written to the memory cell array. The read-enable bar signal line REB is a signal line for outputting a signal which allows data of the memory cell array to be read out. The fourth driver circuit 184 is connected to the step-up circuit 180 through a step-up circuit control signal line BCC. The step-up circuit control signal line BCC is a wiring for transmitting a control signal of the step-up circuit which is output from the controller in the fourth driver circuit 184. No step-up circuit control signal line BCC or one or more step-up circuit control signal lines BCC are provided depending on the circuit configuration. In addition, the fourth driver circuit 184 is connected to the third driver circuit 190 through a page buffer control signal line PBC. The page buffer control signal line PBC is a wiring for transmitting a control signal of the page buffer which is output from the controller in the fourth driver circuit 184. No page buffer control signal line PBC or one or more page buffer control signal lines PBC are provided depending on the circuit configuration. Further, the fourth driver circuit 184 is connected to the second driver circuit 192 through a row driver control signal line RDRVC. Furthermore, the fourth driver circuit 184 is connected to the source line switching circuit 194 through a source line switching signal line SLC.

A delay circuit is provided in the fourth driver circuit 184. The delay circuit is preferably connected to the page buffer control signal line PBC, the row driver control signal line RDRVC, and the source line switching signal line SLC. For example, by connecting the delay circuit to the page buffer control signal line PBC and supplying a delay signal to the page buffer control signal line PBC, the timing of change in potential of the bit line BL can be delayed. In addition, by connecting the delay circuit to the row driver control signal line RDRVC and supplying a delay signal to the row driver control signal line RDRVC, the timing of change in potential of the second word line C can be delayed. Moreover, by connecting the delay circuit to the source line switching signal line SLC and supplying a delay signal to the source line switching signal line SLC, the timing of change in potential of the source line SL can be delayed. Through the above, incorrect writing to the memory cell 170 can be suppressed.

The source line switching circuit 194 is a circuit which switches the potential of the source line SL on the basis of a source line switching signal from the controller in the fourth driver circuit 184. The source line switching circuit 194 has a function of switching the potential of the source line SL, and a multiplexer, an inverter, or the like may be used. The source line switching signal line SLC is a wiring for transmitting a signal which is for switching the potential of the source line SL and is output from the controller in the fourth driver circuit 184. One or more signal lines are provided depending on the circuit configuration.

The fifth driver circuit 186 includes an input-output control circuit. The input-output control circuit is a circuit for outputting an input signal from a data input-output signal line DIO to the internal data input-output signal line INTDIO or outputting an input signal from the internal data input-output signal line INTDIO to the data input-output signal line DIO. A terminal of the data input-output signal line DIO is a terminal to which external data is input or from which memory data is output to the outside. One or more signal lines are provided depending on the circuit configuration. The internal data input-output signal line INTDIO is a signal line for inputting an output signal from the input-output control circuit to the page buffer or inputting an output signal from the page buffer to the input-output control circuit. One or more signal lines are provided depending on the circuit configuration. Further, the data input-output signal line DIO may be divided into a date-input signal line and a data output signal line.

Figure 5A:
FIGS. 5A to 5D are each a circuit diagram of a semiconductor device.
Figure 5B:
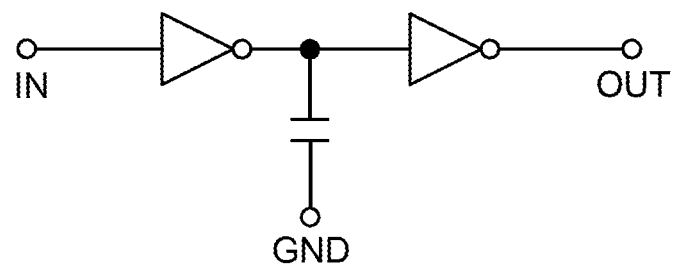
Figure 5C:
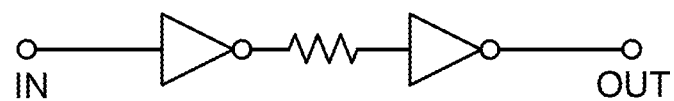
Figure 5D:
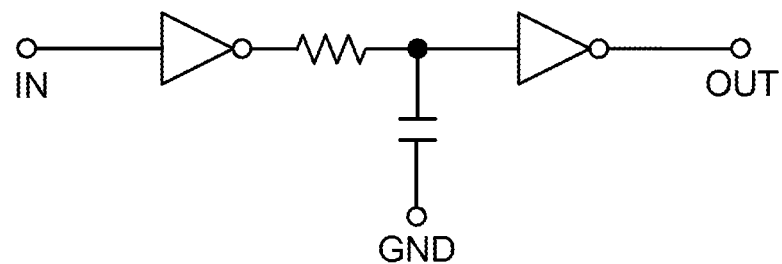

As the delay circuit provided in the fourth driver circuit 184, a circuit in which an even number of inverters are connected in series as illustrated in FIG. 5A can be used. Alternatively, the delay circuit may have a structure in which a capacitor is added to an even number of inverters connected in series as illustrated in FIG. 5B or a structure in which a resistor is added to an even number of inverters connected in series as illustrated in FIG. 5C. Further alternatively, the delay circuit may have a structure in which a resistor and a capacitor are added to an even number of inverter circuits connected in series as illustrated in FIG. 5D. The structure of the delay circuit is not limited to the above.

As described above, in the semiconductor device having the circuit configuration illustrated in FIG. 4, the area of the memory cell array can be reduced by sharing the source line SL with plural columns. Accordingly, the die size can be reduced. Moreover, the reduction in the die size allows cost reduction in manufacturing the semiconductor device and improvement in yield.

Note that the operation method, the operation voltage, and the like relating to the semiconductor device relating to one embodiment of the disclosed invention are not limited to the above description and can be changed appropriately in accordance with an embodiment in which the operation of the semiconductor device is implemented.

The structures, methods, and the like described in this embodiment can be combined as appropriate with any of the structures, methods, and the like described in the other embodiments.

Embodiment 2

In this embodiment, a structure and a manufacturing method of a semiconductor device relating to one embodiment of the disclosed invention will be described with reference to FIGS. 6A and 6B, FIGS. 7A to 7G, FIGS. 8A to 8E, FIGS. 9A to 9D, FIGS. 10A to 10D, and FIGS. 11A to 11C.

<Cross-Sectional Structure and Planar Structure of Semiconductor Device>

Figure 6A:
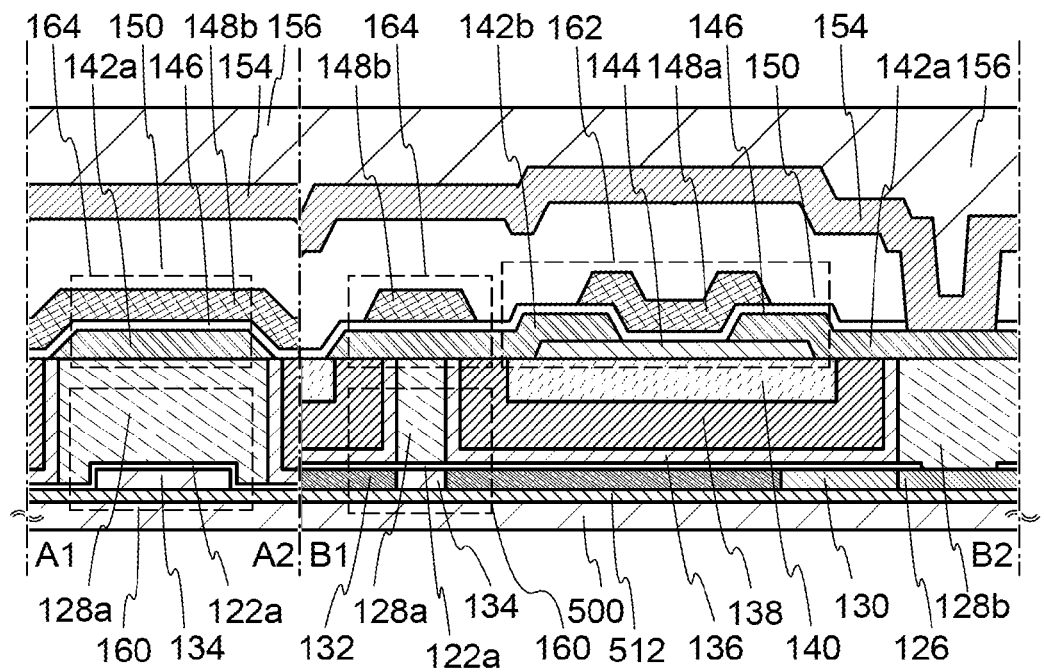
FIGS. 6A and 6B are a cross-sectional view and a plan view of a semiconductor device.
Figure 6B:
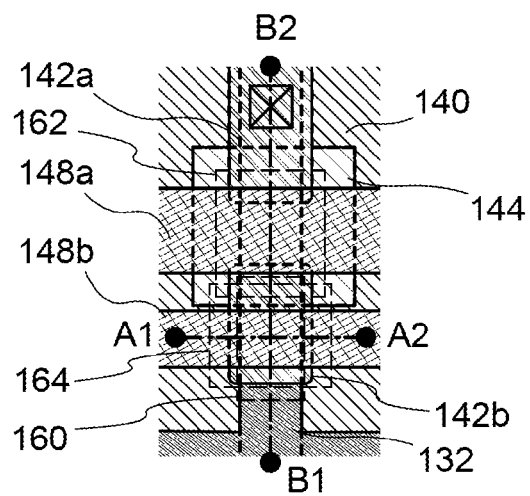

FIGS. 6A and 6B illustrate an example of a structure of a semiconductor device. FIG. 6A illustrates a cross section of the semiconductor device, and FIG. 6B illustrates a plan view of the semiconductor device. FIG. 6A corresponds to a cross section along line A1-A2 and line B1-B2 in FIG. 6B. The semiconductor device illustrated in FIGS. 6A and 6B includes the transistor 160 including a first semiconductor material in a lower portion, and the transistor 162 including a second semiconductor material in an upper portion. It is preferable that the first semiconductor material and the second semiconductor material be different from each other. For example, a semiconductor material other than an oxide semiconductor can be used as the first semiconductor material, and an oxide semiconductor can be used as the second semiconductor material. As the semiconductor material other than an oxide semiconductor, for example, silicon, germanium, silicon germanium, silicon carbide, gallium arsenide, or the like can be used and single crystal semiconductor is preferably used. A transistor including such a semiconductor material can operate at high speed easily. An organic semiconductor material or the like can also be used. On the other hand, a transistor including an oxide semiconductor enables charge to hold for a long time owing to its characteristics. The semiconductor device illustrated in FIGS. 6A and 6B can be used as a memory cell.

The technical feature of the invention disclosed herein lies in the use of a semiconductor material with which off-state current can be sufficiently reduced, such as an oxide semiconductor, in the transistor 162 in order that data may be held. Thus, it is not necessary to limit specific conditions, such as a material, a structure, or the like of the semiconductor device, to those given here.

The transistor 160 in FIGS. 6A and 6B includes a channel formation region 134 provided in a semiconductor layer over a semiconductor substrate 500, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". In other words, in this specification, the term "source electrode" may include a source region.

Further, a conductive layer 128b is connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126. Further, insulating layers 136, 138, and 140 are provided so as to cover the transistor 160. Note that for high integration, it is preferable that, as in FIGS. 6A and 6B, the transistor 160 do not have a sidewall insulating layer. On the other hand, when the characteristics of the transistor 160 have priority, the sidewall insulating layer may be provided on a side surface of the gate electrode 128a, and the impurity region 132 may include a region having a different impurity concentration.

The transistor 162 in FIGS. 6A and 6B includes an oxide semiconductor layer 144 which is provided over the insulating layer 140 and the like; a source electrode (or a drain electrode) 142a and a drain electrode (or a source electrode) 142b which are electrically connected to the oxide semiconductor layer 144; a gate insulating layer 146 which covers the oxide semiconductor layer 144, the source electrode 142a, and the drain electrode 142b; and a gate electrode 148a which is provided over the gate insulating layer 146 so as to overlap with the oxide semiconductor layer 144.

Here, the oxide semiconductor layer 144 is preferably a purified oxide semiconductor layer by sufficient removal of impurities such as hydrogen and by sufficient supply of oxygen. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower, for example. Note that the hydrogen concentration of the oxide semiconductor layer 144 is measured by secondary ion mass spectrometry (SIMS). In the oxide semiconductor layer 144 which is highly purified by sufficient reduction of the concentration of hydrogen therein and in which defect levels in an energy gap due to oxygen deficiency are reduced by sufficient supply of oxygen, the carrier concentration is lower than $1 \times 10^{12}$/cm$^3$, preferably lower than $1 \times 10^{11}$/cm$^3$, further preferably lower than $1.45 \times 10^{10}$/cm$^3$. For example, the off-state current (here, per unit channel width (μm)) at room temperature (25° C.) is lower than or equal to 100 zA (1 zA (zeptoampere) is $1 \times 10^{-21}$ A), preferably lower than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

It is preferable that impurities such as alkali metals or alkaline earth metals be sufficiently removed from the oxide semiconductor layer 144. For example, in the oxide semiconductor layer 144, the sodium concentration is lower than or equal to $5 \times 10^{16}$ cm$^{-3}$, preferably lower than or equal to $1 \times 10^{16}$ cm$^{-3}$, further preferably lower than or equal to $1 \times 10^{15}$ cm$^{-3}$; the lithium concentration is lower than or equal to $5 \times 10^{15}$ cm$^{-3}$, preferably lower than or equal to $1 \times 10^{15}$ cm$^{-3}$, and the potassium concentration is lower than or equal to $5 \times 10^{15}$ cm$^{-3}$; preferably lower than or equal to $1 \times 10^{15}$ cm$^{-3}$. The sodium concentration, the lithium concentration, and the potassium concentration in the oxide semiconductor layer 144 are measured by secondary ion mass spectrometry (SIMS).

An alkali metal and an alkaline earth metal are adverse impurities for an oxide semiconductor and are preferably contained as little as possible. An alkali metal, in particular, Na diffuses into an oxide and becomes Na$^+$ when an insulating layer in contact with the oxide semiconductor layer is an oxide. In addition, Na cuts the bond between a metal and oxygen or enters the bond in the oxide semiconductor layer. As a result, transistor characteristics deteriorate (e.g., the transistor becomes normally-on (the shift of a threshold voltage to a negative side) or the mobility is decreased). In addition, this also causes variation in the characteristics. Such problems become evident especially in the case where the hydrogen concentration in the oxide semiconductor layer is sufficiently low. Thus, the concentration of an alkali metal is strongly required to set to the above value in the case where the hydrogen concentration in the oxide semiconductor layer is lower than or equal to $5\times10^{19}$ cm$^{-3}$, particularly lower than or equal to $5\times10^{18}$ cm$^{-3}$.

The oxide semiconductor layer 144 is preferably highly purified so as to hardly contain impurities such as copper, aluminum, and chlorine. In the process for manufacturing the transistor, steps in which these impurities are not mixed or attached to a surface of the oxide semiconductor layer are preferably selected as appropriate. In the case where the impurities are attached to the surface of the oxide semiconductor layer, the impurities on the surface of the oxide semiconductor layer are preferably removed by exposure to oxalic acid, dilute hydrofluoric acid, or the like or by plasma treatment (such as N$_2$O plasma treatment). Specifically, the copper concentration of the oxide semiconductor layer is lower than or equal to $1\times10^{18}$ atoms/cm$^3$, preferably lower than or equal to $1\times10^{17}$ atoms/cm$^3$. In addition, the aluminum concentration of the oxide semiconductor layer is lower than or equal to $1\times10^{18}$ atoms/cm$^3$. Further, the chlorine concentration of the oxide semiconductor layer is lower than or equal to $2\times10^{18}$ atoms/cm$^3$. Note that the aluminum concentration is not limited to the above in the case where aluminum is contained in a main component of the oxide semiconductor layer 144.

Note that although the transistor 162 in FIGS. 6A and 6B includes the oxide semiconductor layer 144 which is processed into an island shape in order that leakage current which is caused between elements owing to miniaturization may be suppressed, the oxide semiconductor layer 144 which is not processed into an island shape may be used. In the case where the oxide semiconductor layer is not processed into an island shape, contamination of the oxide semiconductor layer 144 due to etching in the processing can be prevented.

The capacitor 164 in FIGS. 6A and 6B includes the drain electrode 142b, the gate insulating layer 146, and a conductive layer 148b. In other words, the drain electrode 142b functions as one electrode of the capacitor 164, and the conductive layer 148b functions as the other electrode of the capacitor 164. With such a structure, capacitance can be secured sufficiently. Further, insulation between the drain electrode 142b and the conductive layer 148b can be sufficiently secured by stacking the oxide semiconductor layer 144 and the gate insulating layer 146. The capacitor 164 may be omitted in the case where a capacitor is not needed.

In this embodiment, the transistor 162 and the capacitor 164 are provided so that at least parts of the transistor 162 and the capacitor 164 overlap with the transistor 160. With such a planar layout, the degree of integration can be increased. For example, given that the minimum feature size is F, the area occupied by a memory cell can be 15F$^2$ to 25F$^2$.

An insulating layer 150 is provided over the transistor 162 and the capacitor 164. A wiring 154 is provided in an opening formed in the gate insulating layer 146 and the insulating layer 150. The wiring 154 is a wiring which connects one memory cell to another memory cell and corresponds to the bit line BL in the circuit diagrams in FIGS. 2A and 2B. The wiring 154 is connected to the impurity region 126 through the source electrode 142a and the conductive layer 128b. The above structure allows a reduction in the number of wirings as compared with a structure in which the source region or the drain region in the transistor 160 and the source electrode 142a in the transistor 162 are connected to different wirings. Thus, the degree of integration of a semiconductor device can be increased.

Since the conductive layer 128b is provided, the position where the impurity region 126 and the source electrode 142a are connected to each other and the position where the source electrode 142a and the wiring 154 are connected to each other can overlap with each other. Such a planar layout makes it possible to suppress an increase in the element area due to contact regions. In other words, the degree of integration of the semiconductor device can be increased.

<Manufacturing Method of SOI Substrate>

Next, an example of a method for manufacturing an SOI substrate which can be used for manufacturing the above semiconductor device will be described with reference to FIGS. 7A to 7G.

Figure 7A:
FIGS. 7A to 7G are cross-sectional views of manufacturing steps of a semiconductor device.
Figure 7B:

First, the semiconductor substrate 500 is prepared as a base substrate (see FIG. 7A). As the semiconductor substrate 500, a semiconductor substrate such as a single crystal silicon substrate or a single crystal germanium substrate can be used. As the semiconductor substrate, a solar grade silicon (SOG-Si) substrate or the like may also be used. Alternatively, a polycrystalline semiconductor substrate may be used. In the case of using a SOG-Si substrate, a polycrystalline semiconductor substrate, or the like, manufacturing cost can be lower than that in the case of using a single crystal silicon substrate or the like.

Note that instead of the semiconductor substrate 500, any of a variety of glass substrates used in the electronics industry, such as substrates made of aluminosilicate glass, aluminoborosilicate glass, and barium borosilicate glass; a quartz substrate; a ceramic substrate; and a sapphire substrate can be used. Alternatively, a ceramic substrate which contains silicon nitride and aluminum nitride as its main components and whose coefficient of thermal expansion is close to that of silicon may also be used.

A surface of the semiconductor substrate 500 is preferably cleaned in advance. Specifically, the semiconductor substrate 500 is preferably cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 510 is used as the bond substrate (see FIG. 7B). Note that the bond substrate is not limited to a single crystal semiconductor substrate, and may be a polycrystalline semiconductor substrate.

As the single crystal semiconductor substrate 510, for example, a single crystal semiconductor substrate formed using an element of Group 14, such as a single crystal silicon substrate, a single crystal germanium substrate, or a single crystal silicon germanium substrate, can be used. Alternatively, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to a circular shape, and the single crystal semiconductor substrate 510 may be a substrate which has been processed into, for example, a rectangular shape or the like. The single crystal semiconductor substrate 510 can be formed by a Czochralski (CZ) method or a Floating Zone (FZ) method.

Figure 7C:
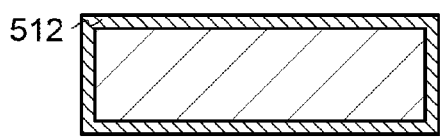

An oxide film 512 is formed on a surface of the single crystal semiconductor substrate 510 (see FIG. 7C). In view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), a hydrofluoric acid/hydrogen peroxide mixture (FPM), or the like before the formation of the oxide film 512. Dilute hydrofluoric acid and ozone water may be discharged alternately for cleaning.

The oxide film 512 can be formed with, for example, a single layer of a silicon oxide film, a silicon oxynitride film, or the like, or a stacked layer of any of these films. As a method for manufacturing the oxide film 512, a thermal oxidation method, a CVD method, a sputtering method, or the like can be used. In the case where the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

Thermal oxidation treatment is performed on the single crystal semiconductor substrate 510 is performed in an oxidizing atmosphere to which chlorine (Cl) is added, whereby the oxide film 512 can be formed through chlorine oxidation, for example. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced.

Note that the halogen atoms contained in the oxide film 512 are not limited to chlorine atoms. Fluorine atoms may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 7D:
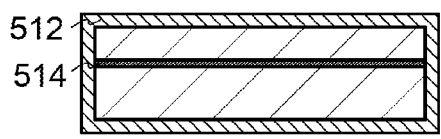
Figure 7E:
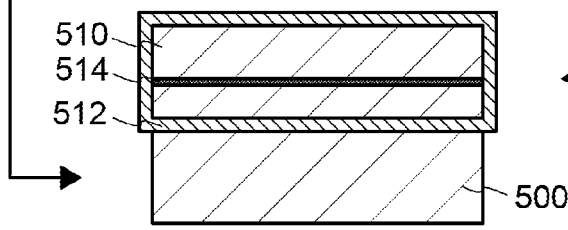

Next, ions are accelerated by an electric field and the single crystal semiconductor substrate 510 is irradiated with the ions, and the ions are added to the single crystal semiconductor substrate 510, whereby an embrittled region 514 where the crystal structure is damaged is formed in the single crystal semiconductor substrate 510 at a predetermined depth (see FIG. 7D).

The depth at which the embrittled region 514 is formed can be adjusted by the kinetic energy, mass, charge, or incidence angle of the ions, or the like. The embrittled region 514 is formed at approximately the same depth as the average penetration depth of the ions. Thus, the thickness of a single crystal semiconductor layer to be separated from the single crystal semiconductor substrate 510 can be adjusted with the depth at which the ions are added. For example, the average penetration depth may be controlled so that the thickness of the single crystal semiconductor layer is approximately 10 nm to 500 nm, preferably, 50 nm to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation apparatus. In the ion-implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set 50% or higher (further preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared with the case of performing irradiation with hydrogen and helium in different steps, and surface roughness of a single crystal semiconductor layer to be formed later can be suppressed.

Note that heavy metal might also be added when the embrittled region 514 is formed with an ion doping apparatus; however, the ion irradiation is performed through the oxide film 512 containing halogen atoms, whereby contamination of the single crystal semiconductor substrate 510 due to the heavy metal can be prevented.

Then, the semiconductor substrate 500 and the single crystal semiconductor substrate 510 are disposed to face each other and are made to be closely attached to each other with the oxide film 512 therebetween. As a result, the semiconductor substrate 500 and the single crystal semiconductor substrate 510 are bonded to each other (see FIG. 7E). Note that an oxide film or a nitride film may be formed on the surface of the semiconductor substrate 500 to which the single crystal semiconductor substrate 510 is attached.

When bonding is performed, it is preferable that pressure greater than or equal to 0.001 $N/cm^2$ and less than or equal to 100 $N/cm^2$, e.g., a pressure greater than or equal to 1 $N/cm^2$ and less than or equal to 20 $N/cm^2$, be applied to one part of the semiconductor substrate 500 or one part of the single crystal semiconductor substrate 510. When the bonding surfaces are made close to each other and disposed in close contact with each other by applying a pressure, a bonding between the semiconductor substrate 500 and the oxide film 512 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, surfaces to be bonded to each other are preferably subjected to surface treatment. Surface treatment can improve the bonding strength at the interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Heat treatment for increasing the bonding strength may be performed after bonding. This heat treatment is performed at a temperature at which separation at the embrittled region 514 does not occur (for example, a temperature higher than or equal to room temperature and lower than 400° C.). Bonding of the semiconductor substrate 500 and the oxide film 512 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and the semiconductor device relating to one embodiment of the disclosed invention should not be construed as being limited to this example.

Figure 7F:
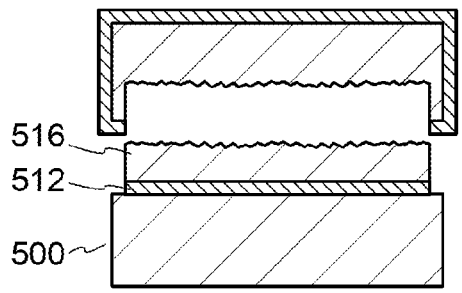

Next, heat treatment is performed for separation of the single crystal semiconductor substrate 510 at the embrittled region, whereby a single crystal semiconductor layer 516 is formed over the semiconductor substrate 500 with the oxide film 512 provided therebetween (see FIG. 7F).

Note that it is desirable that the temperature for heat treatment in the separation be as low as possible. This is because as the temperature in the separation is low, generation of roughness on a surface of the single crystal semiconductor layer 516 can be suppressed. Specifically, the temperature for the heat treatment in the separation may be higher than or equal to 300° C. and lower than or equal to 600° C., for example, and the heat treatment is more effective when the temperature is higher than or equal to 400° C. and lower than or equal to 500° C.

After the single crystal semiconductor substrate 510 is separated, the single crystal semiconductor layer 516 may be subjected to heat treatment at 500° C. or higher so that the concentration of hydrogen remaining in the single crystal semiconductor layer 516 is reduced.

Figure 7G:
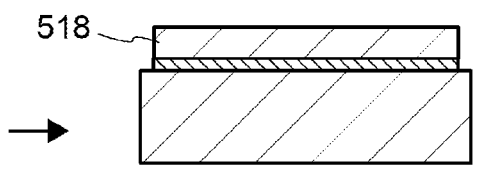

Next, the surface of the single crystal semiconductor layer 516 is irradiated with laser light, whereby a single crystal semiconductor layer 518 whose surface planarity is improved and in which defects are reduced is formed (see FIG. 7G). Note that instead of the laser light irradiation treatment, heat treatment may be performed.

Although the laser light irradiation treatment is performed immediately after the heat treatment for separation of the single crystal semiconductor layer 516 in this embodiment, the semiconductor device relating to one embodiment of the present invention is not construed as being limited to this. Etching treatment may be performed after the heat treatment for separation of the single crystal semiconductor layer 516, to remove a region where there are many defects on the surface of the single crystal semiconductor layer 516, and then the laser light irradiation treatment may be performed. Alternatively, the laser light irradiation treatment may be performed after the surface planarity of the single crystal semiconductor layer 516 is improved. Note that the etching treatment may be either wet etching or dry etching. In this embodiment, after the laser light irradiation, a step of reducing the thickness of the single crystal semiconductor layer 516 may be performed. To reduce the thickness of the single crystal semiconductor layer 516, one of or both of dry etching and wet etching may be employed.

Through the above steps, an SOI substrate including the single crystal semiconductor layer 518 can be obtained (see FIG. 7G).

<Manufacturing Method of Semiconductor Device>

Next, a method for manufacturing a semiconductor device including the above SOI substrate will be described with reference to FIGS. 8A to 8E, FIGS. 9A to 9D, FIGS. 10A to 10D, and FIGS. 11A to 11C.

<Manufacturing Method of Transistor in Lower Portion>

Here, a method for manufacturing the transistor 160 in the lower portion will be described with reference to FIGS. 8A to 8E and FIGS. 9A to 9D. Note that FIGS. 8A to 8E and FIGS. 9A to 9D illustrate part of the SOI substrate formed by the method illustrated in FIGS. 7A to 7G, and are cross-sectional views illustrating the steps for manufacturing the transistor in the lower portion illustrated in FIG. 6A.

Figure 8A:
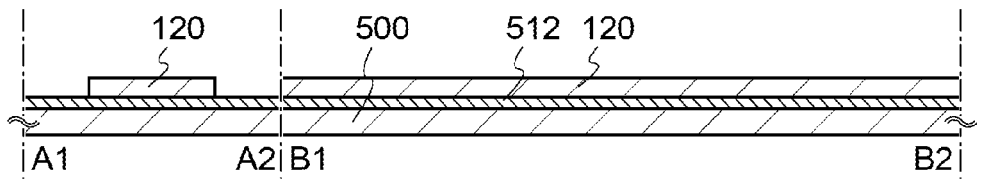
FIGS. 8A to 8E are cross-sectional views of manufacturing steps of a semiconductor device.

First, the single crystal semiconductor layer 518 is processed into an island shape to form a semiconductor layer 120 (see FIG. 8A). Note that before or after this step, an impurity element imparting n-type conductivity or an impurity element imparting p-type conductivity may be added to the semiconductor layer in order that the threshold voltage of the transistor may be controlled. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 8B:
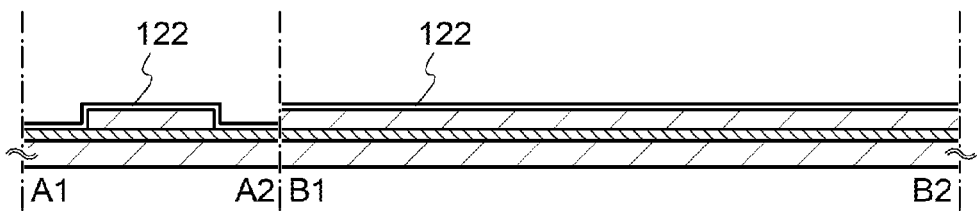

Next, an insulating layer 122 is formed so as to cover the semiconductor layer 120 (see FIG. 8B). The insulating layer 122 is to be a gate insulating layer later. The insulating layer 122 can be formed, for example, by performing heat treatment (e.g., thermal oxidation treatment or thermal nitridation treatment) on a surface of the semiconductor layer 120. High-density plasma treatment may be employed instead of heat treatment. The high-density plasma treatment can be performed using, for example, a gas containing one or more of a rare gas such as He, Ar, Kr, or Xe; oxygen; nitrogen oxide; ammonia; nitrogen; hydrogen; and the like. Needless to say, the insulating layer may be formed by a CVD method, a sputtering method, or the like. The insulating layer 122 preferably has a single-layer structure or a stacked structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like. The thickness of the insulating layer 122 can be, for example, greater than or equal to 1 nm and less than or equal to 100 nm, preferably greater than or equal to 10 nm and less than or equal to 50 nm. Here, a single layer of an insulating layer containing silicon oxide is formed by a plasma CVD method.

Figure 8C:
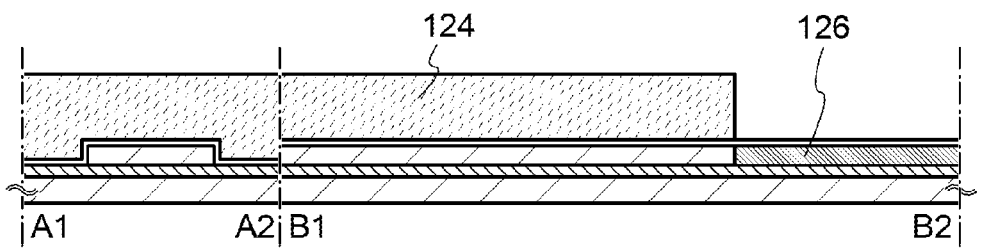

Then, a mask 124 is formed over the insulating layer 122 and an impurity element imparting one conductivity type is added to the semiconductor layer 120, so that the impurity region 126 is formed (see FIG. 8C). Note that here, the mask 124 is removed after the impurity element is added.

Figure 8D:
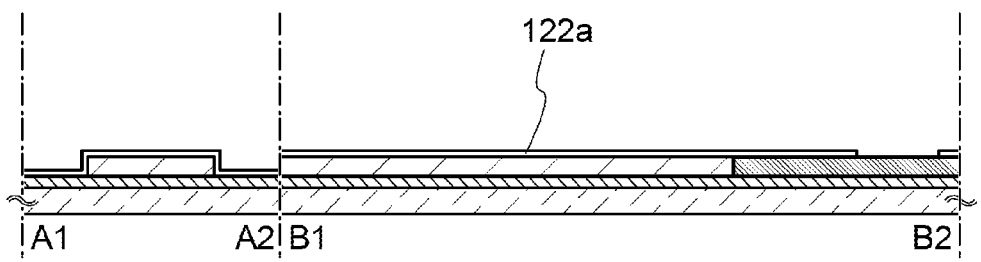

Next, a mask is formed over the insulating layer 122 and a region of the insulating layer 122 that overlaps with the impurity region 126 is partly removed, so that the gate insulating layer 122a is formed (see FIG. 8D). The part of the insulating layer 122 can be removed by etching such as wet etching or dry etching.

Figure 8E:
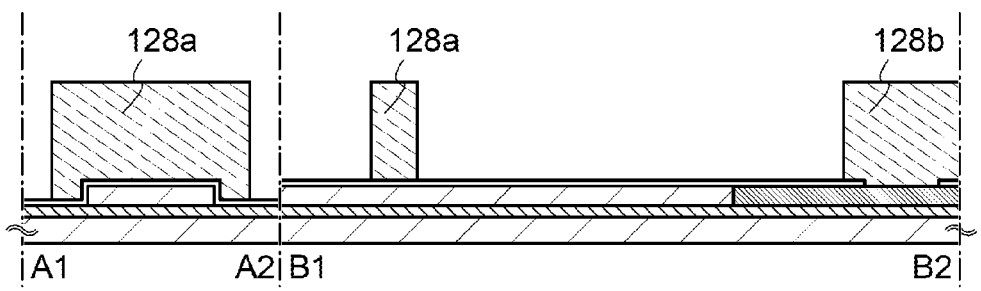

After that, a conductive layer for forming a gate electrode (including a wiring formed using the same layer as the gate electrode) is formed over the gate insulating layer 122a and is processed to form the gate electrode 128a and the conductive layer 128b (see FIG. 8E).

The conductive layer used for the gate electrode 128a and the conductive layer 128b can be formed using a metal material such as aluminum, copper, titanium, tantalum, or tungsten. The conductive layer may be formed using a semiconductor material such as polycrystalline silicon. There is no particular limitation on the method for forming the conductive layer, and any of a variety of film formation methods such as an evaporation method, a CVD method, a sputtering method, and a spin coating method can be employed. The conductive layer may be processed by etching using a resist mask.

Figure 9A:
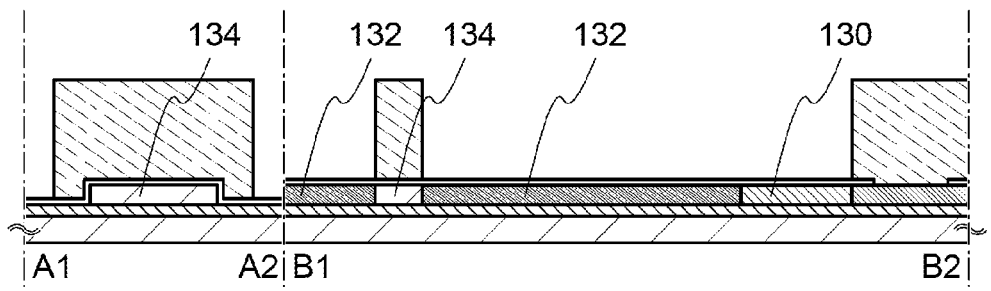
FIGS. 9A to 9D are cross-sectional views of manufacturing steps of a semiconductor device.

Next, an impurity element imparting one conductivity type is added to the semiconductor layer with the use of the gate electrode 128a and the conductive layer 128b as masks, so that the channel formation region 134, the impurity region 132, and the impurity region 130 are formed (see FIG. 9A). Here, an impurity element such as boron (B) or aluminum (Al) is added to form a p-channel transistor. The concentration of the impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130.

Figure 9B:
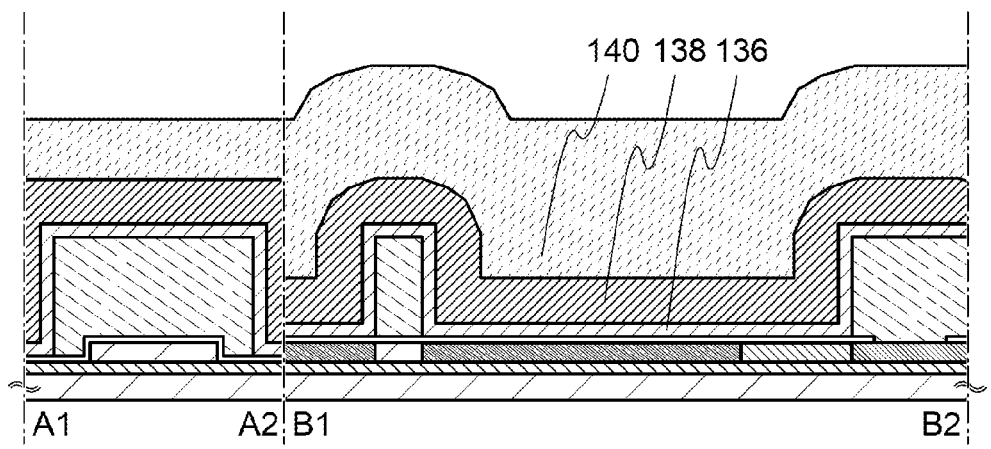

Then, the insulating layer 136, the insulating layer 138, and the insulating layer 140 are formed so as to cover the gate insulating layer 122a, the gate electrode 128a, and the conductive layer 128b (see FIG. 9B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. In particular, the insulating layer 136, the insulating layer 138, and the insulating layer 140 are preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has low dielectric constant as compared with a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A stacked structure of the insulating layer 136, the insulating layer 138, and the insulating layer 140 is employed here; however, the semiconductor device relating to one embodiment of the disclosed invention is not limited to this. A single-layer structure, a stacked structure of two layers, or a stacked structure of four or more layers may also be used.

Figure 9C:
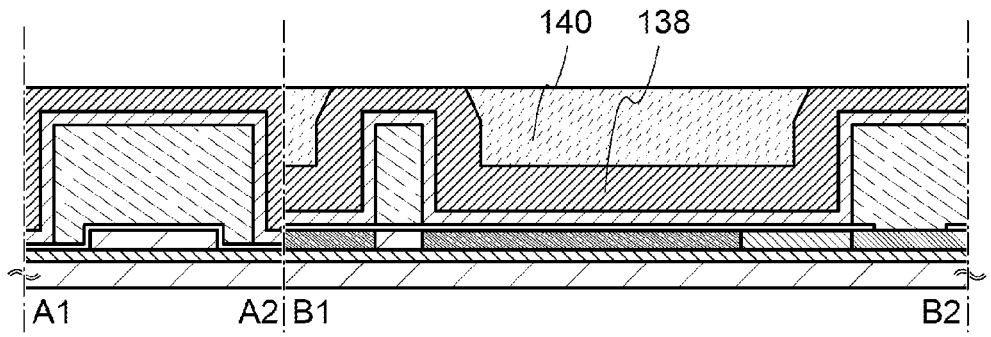

Next, the insulating layer 138 and the insulating layer 140 are subjected to chemical mechanical polishing (CMP) treatment or etching treatment, so that the insulating layer 138 and the insulating layer 140 are flattened (see FIG. 9C). Here, CMP treatment is performed until the insulating layer 138 is partly exposed. In the case where silicon nitride oxide is used for the insulating layer 138 and silicon oxide is used for the insulating layer 140, the insulating layer 138 functions as an etching stopper.

Figure 9D:
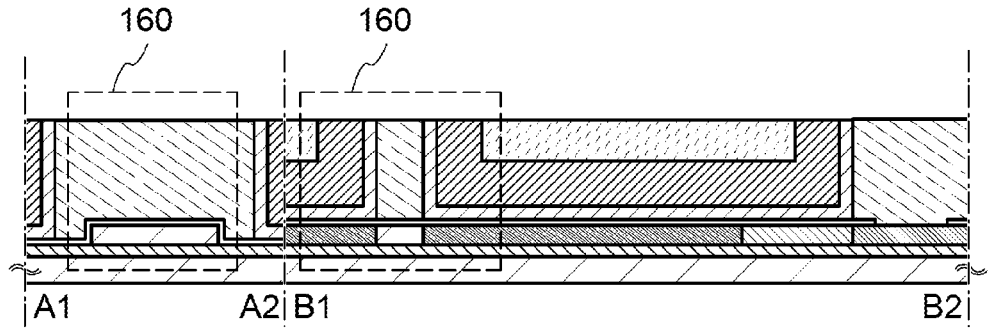

After that, the insulating layer 138 and the insulating layer 140 are subjected to CMP treatment or etching treatment, so that upper surfaces of the gate electrode 128a and the conductive layer 128b are exposed (see FIG. 9D). Here, etching is performed until the gate electrode 128a and the conductive layer 128b are partly exposed. For the etching treatment, dry etching is preferably performed, but wet etching may also be performed. In the step of partly exposing the gate electrode 128a and the conductive layer 128b, to improve the characteristics of the transistor 162 which is formed later, the surfaces of the insulating layer 136, the insulating layer 138, and the insulating layer 140 are preferably flattened as much as possible.

Through the above steps, the transistor 160 in the lower portion can be formed (see FIG. 9D).

Note that before or after each of the above steps, a step for forming an additional electrode, wiring, semiconductor layer, or insulating layer may be performed. For example, a multi-layer wiring structure in which an insulating layer and a conductive layer are stacked is employed as a wiring structure, so that a highly-integrated semiconductor device can be provided.

<Manufacturing Method of Transistor in Upper Portion>

Here, a method for manufacturing the transistor 162 in the upper portion will be described with reference to FIGS. 10A to 10D and FIGS. 11A to 11C.

Figure 10A:
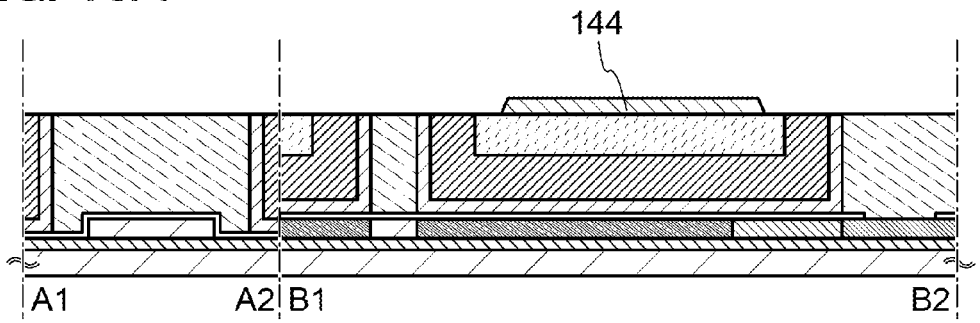
FIGS. 10A to 10D are cross-sectional views of manufacturing steps of a semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 10A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, or a CVD method such as a plasma CVD method.

An oxide semiconductor used for the oxide semiconductor layer contains at least indium (In). It is preferable that In and zinc (Zn) be contained. As a stabilizer for reducing changes in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide, tin oxide, zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

Alternatively, a material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the oxide semiconductor containing indium is not limited to those described above, and a material having an appropriate composition may be used in accordance with necessary semiconductor characteristics (such as mobility, threshold voltage, and variation). To obtain necessary semiconductor characteristics, it is preferable that the carrier concentration, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the r-neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2((a-A)^2+(b-B)^2+(c-C)^2$ is less than or equal to $r^2$), and r may be 0.05, for example. The same applies to other oxides.

The oxide semiconductor layer is in a single crystal state, a polycrystalline (also referred to as polycrystal) state, an amorphous state, or the like.

The oxide semiconductor layer is preferably a CAAC-OS (c-axis aligned crystalline oxide semiconductor) film.

The CAAC-OS film is not completely single crystal nor completely amorphous. The CAAC-OS film is an oxide semiconductor layer with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned with a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor layer, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

In a transistor including a CAAC-OS film, a change in electrical characteristics due to irradiation with visible light or ultraviolet light is small. Thus, the transistor has high reliability.

Note that nitrogen may be substituted for part of oxygen included in the oxide semiconductor layer.

In an oxide semiconductor including crystal parts such as CAAC-OS, defects in the bulk can be further reduced and when a surface flatness is improved, mobility higher than that of an amorphous oxide semiconductor can be obtained. To improve the surface flatness, the oxide semiconductor is preferably formed over a flat surface. Specifically, the oxide semiconductor is preferably formed over a surface with an average surface roughness (Ra) of less than or equal to 1 nm, preferably less than or equal to 0.3 nm, further preferably less than or equal to 0.1 nm.

The thickness of the oxide semiconductor layer is preferably greater than or equal to 3 nm and less than or equal to 30 nm for the following reason: the transistor might be normally on when the oxide semiconductor layer is too thick (e.g., a thickness of 50 nm or more).

The oxide semiconductor layer is preferably formed by a method in which impurities such as hydrogen, water, hydroxyl groups, or hydride do not enter the oxide semiconductor layer. For example, a sputtering method can be used.

In this embodiment, the oxide semiconductor layer is formed by a sputtering method with the use of an In—Ga—Zn-based oxide target.

As the In—Ga—Zn—O-based oxide target, for example, an oxide target having a composition of $In_2O_3$:$Ga_2O_3$:

ZnO=1:1:1 [molar ratio] can be used. Note that it is not necessary to limit the material and the composition of the target to the above. For example, an oxide target having a composition of $In_2O_3:Ga_2O_3:ZnO=1:1:2$ [molar ratio] can also be used.

In the case where an In—Zn—O-based material is used for the oxide semiconductor, a target therefor has a composition of In:Zn=50:1 to 1:2 in an atomic ratio ($In_2O_3:ZnO=25:1$ to 1:4 in a molar ratio), preferably, In:Zn=20:1 to 1:1 in an atomic ratio ($In_2O_3:ZnO=10:1$ to 1:2 in a molar ratio), further preferably, In:Zn=15:1 to 1.5:1 in an atomic ratio ($In_2O_3$: ZnO=15:2 to 3:4 in a molar ratio). For example, as for a target used for formation of an In—Zn—O-based oxide semiconductor which has an atomic ratio of In:Zn:O=X:Y:Z, the relation of Z>1.5X+Y is satisfied.

The filling rate of the oxide target is higher than or equal to 90% and lower than or equal to 100%, preferably higher than or equal to 95% and lower than or equal to 99.9%. With the use of the metal oxide target with a high filling rate, a dense oxide semiconductor layer can be formed.

As a sputtering gas, a rare gas (typically an argon gas), an oxygen gas, or a mixed gas of a rare gas and an oxygen gas may be used. To prevent hydrogen, water, a hydroxyl group, hydride, or the like from entering the oxide semiconductor layer, a high-purity gas from which impurities such as hydrogen, water, hydroxyl groups, or hydride are removed is preferably used as the sputtering gas.

For example, the oxide semiconductor layer can be formed described below.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas from which impurities such as hydrogen, water, hydroxyl groups, or hydride are sufficiently removed is introduced into the deposition chamber from which remaining moisture is being removed, and the oxide semiconductor layer is formed over the substrate with the use of the target. To remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which is evacuated with the cryopump, for example, impurities such as hydrogen, water, hydroxyl groups, or hydride (preferably, also a compound containing a carbon atom) or the like are removed, whereby the concentration of impurities such as hydrogen, water, hydroxyl groups, or hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed with the substrate heated at the temperature in the above range, the substrate temperature is increased, so that hydrogen bonds are cut by heat and the substance including a hydrogen atom is less likely to be taken into the oxide semiconductor layer. Thus, the oxide semiconductor layer is formed with the substrate heated at the above temperature, whereby the concentration of impurities such as hydrogen, water, hydroxyl groups, or hydride in the oxide semiconductor layer can be sufficiently reduced. Moreover, damage due to sputtering can be reduced.

An example of the film formation conditions is as follows: the distance between the substrate and the target is 60 mm, the pressure is 0.4 Pa, the direct-current (DC) power is 0.5 kW, the substrate temperature is 400° C., and oxygen (the proportion of the oxygen flow rate is 100%) is used as a sputtering gas. Note that a pulse direct-current power source is preferable because powdery substances (also referred to as particles or dust) generated in deposition can be reduced and the film thickness can be uniform.

Note that before the oxide semiconductor layer is formed by a sputtering method, powdery substances (also referred to as particles or dust) attached on a surface over which the oxide semiconductor layer is formed are preferably removed by reverse sputtering in which an argon gas is introduced and plasma is generated. The reverse sputtering refers to a method in which voltage is applied to a substrate side to generate plasma in the vicinity of the substrate to modify a surface. Note that a gas of nitrogen, helium, oxygen or the like may be used instead of an argon gas.

The oxide semiconductor layer can be processed by being etched after a mask having a desired shape is formed over the oxide semiconductor layer. The mask may be formed by a method such as photolithography or an ink-jet method. Note that the etching of the oxide semiconductor layer may be dry etching or wet etching. Needless to say, both of them may be employed in combination.

After that, heat treatment (first heat treatment) may be performed on the oxide semiconductor layer 144. The heat treatment further removes substances including hydrogen atoms in the oxide semiconductor layer 144, and can order a structure of the oxide semiconductor layer 144, whereby defect level in energy gap can be reduced. The heat treatment is performed in an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed in such a manner that, for example, an object to be heated is introduced into an electric furnace in which a resistance heating element or the like is used, and heated at 450° C. in a nitrogen atmosphere for an hour. The oxide semiconductor layer 144 is not exposed to the air during the heat treatment so that entry of water and hydrogen can be prevented.

The above heat treatment has an effect of removing hydrogen, water, and the like and can be referred to as dehydration treatment, dehydrogenation treatment, or the like. The heat treatment can be performed at the timing, for example, before the oxide semiconductor layer is processed into an island shape or after the gate insulating film is formed. Such dehydration treatment or dehydrogenation treatment may be performed once or plural times.

Figure 10B:
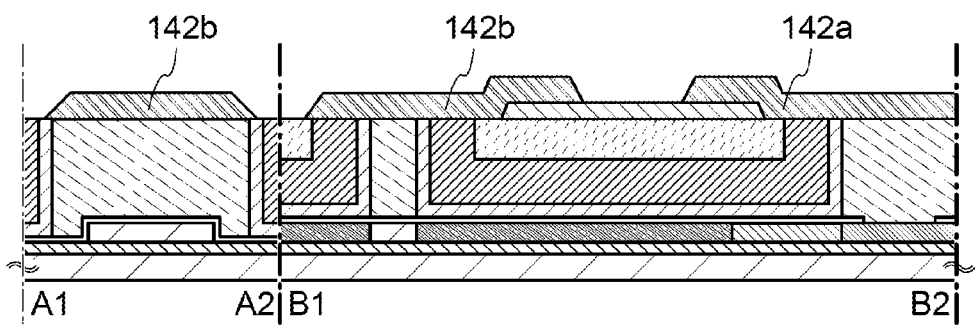

Next, a conductive layer for forming a source electrode and a drain electrode (including a wiring formed in the same layer as the source electrode and the drain electrode) is formed over the oxide semiconductor layer 144 and the like and is processed, so that the source and drain electrodes 142a and 142b are formed (see FIG. 10B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. One or more materials selected from manganese, magnesium, zirconium, beryllium, neodymium, and scandium may also be used.

The conductive layer may have a single-layer structure or a stacked structure including two or more layers. For example, the conductive layer may have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source electrode 142a and the drain electrode 142b having tapered shapes.

The conductive layer may be formed using a conductive metal oxide. As the conductive metal oxide, indium oxide ($In_2O_3$), tin oxide ($SnO_2$), zinc oxide (ZnO), an indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used.

The conductive layer is preferably etched so that end portions of the source electrode 142a and the drain electrode 142b that are to be formed are tapered. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower edge portions of the source electrode 142a and the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers or an electron beam. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization allows low power consumption of a semiconductor device.

Figure 10C:
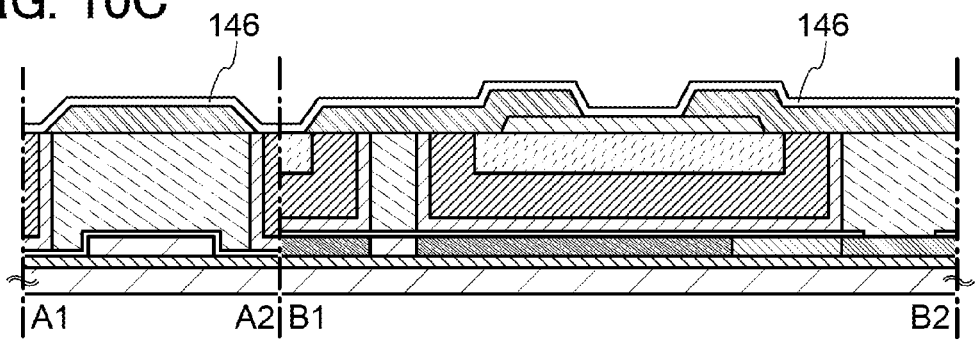

Next, the gate insulating layer 146 is formed so as to cover the source electrode 142a and the drain electrode 142b and to be in contact with part of the oxide semiconductor layer 144 (see FIG. 10C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0) to which nitrogen is added, or the like. The gate insulating layer 146 may have a single-layer structure or a stacked structure in which these elements are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as described above, a problem of gate leakage due to a tunnel effect or the like is caused. To solve the problem of gate leakage, a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added is preferably used for the gate insulating layer 146. The use of a high-k material for the gate insulating layer 146 makes it possible to ensure electrical characteristics and to increase the thickness in order that gate leakage may be suppressed. Note that a stacked structure of a film containing a high-k material and a film containing any one of silicon oxide, silicon nitride, silicon oxynitride, silicon nitride oxide, aluminum oxide, and the like may be employed.

Further, an insulating layer in contact with the oxide semiconductor layer 144 (in this embodiment, the gate insulating layer 146) may be formed using an insulating material containing an element belonging to Group 13 and oxygen. Many oxide semiconductor materials contain an element belonging to Group 13, and an insulating material containing an element belonging to Group 13 is compatible with an oxide semiconductor. By using such an insulating material for the insulating layer in contact with the oxide semiconductor layer, an interface with the oxide semiconductor layer can be kept favorable.

Here, an insulating material containing an element belonging to Group 13 refers to an insulating material containing one or more elements belonging to Group 13. As examples of the insulating material containing an element belonging to Group 13, gallium oxide, aluminum oxide, aluminum gallium oxide, gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming a gate insulating layer in contact with an oxide semiconductor layer containing gallium, the use of a material containing gallium oxide for the gate insulating layer allows the characteristics of the interface between the oxide semiconductor layer and the gate insulating layer to be kept favorable. Moreover, when the oxide semiconductor layer and the insulating layer containing gallium oxide are provided in contact with each other, pileup of hydrogen at the interface between the oxide semiconductor layer and the insulating layer can be reduced. Note that a similar effect can be obtained in the case where an element belonging to the same group as a constituent element of the oxide semiconductor is used for the insulating layer. For example, it is effective to form an insulating layer with the use of a material containing aluminum oxide. Aluminum oxide is impermeable to water. Thus, it is preferable to use a material containing aluminum oxide in terms of preventing entry of water to the oxide semiconductor layer.

The insulating layer in contact with the oxide semiconductor layer 144 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by an ion implantation method or an ion doping method.

For example, in the case where the insulating layer in contact with the oxide semiconductor layer 144 is formed using gallium oxide, the composition of gallium oxide can be set to be $Ga_2O_x$ ($x=3+\alpha$, $0<\alpha<1$) by heat treatment in an oxygen atmosphere or oxygen doping. Further, in the case where the insulating layer in contact with the oxide semiconductor layer 144 is formed using aluminum oxide, the composition of aluminum oxide can be set to be $Al_2O_x$ ($x=3+\alpha$, $0<\alpha<1$) by heat treatment in an oxygen atmosphere or oxygen doping. Further, in the case where the insulating layer in contact with the oxide semiconductor layer 144 is formed using gallium aluminum oxide (or aluminum gallium oxide), the composition of gallium aluminum oxide (or aluminum gallium oxide) can be set to be $Ga_xAl_{2-x}O_{3+\alpha}$ ($0<x<2$, $0<\alpha<1$) by heat treatment in an oxygen atmosphere or oxygen doping.

By oxygen doping or the like, an insulating layer which includes a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, which allows oxygen deficiency in the oxide semiconductor layer or at an interface between the oxide semiconductor layer and the insulating layer to be reduced.

The insulating layer which includes a region where the proportion of oxygen is higher than that in the stoichiometric composition may be applied to the insulating layer which serves as a base film of the oxide semiconductor layer 144, instead of the gate insulating layer 146, or may be applied to both the gate insulating layer 146 and the base film.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. in a nitrogen atmosphere for an hour. The second heat treatment allows a reduction in variation in the electrical characteristics of the transistor. Further, in the case where the gate insulating layer 146 contains oxygen, oxygen is supplied to the oxide semiconductor layer 144 which has been subjected to the dehydration treatment or dehydrogenation treatment to compensate for oxygen deficiency in the oxide semiconductor layer 144, so that an i-type (intrinsic) or substantially i-type oxide semiconductor layer can be formed.

Note that although the second heat treatment is performed after the gate insulating layer 146 is formed in this embodiment, the timing of the second heat treatment is not limited thereto. The second heat treatment may be performed, for example, after the gate electrode is formed.

As described above, the first heat treatment and the second heat treatment are applied, whereby the oxide semiconductor layer 144 can be highly purified so as to minimize the amount of elements that are not main components of the oxide semiconductor.

Figure 10D:
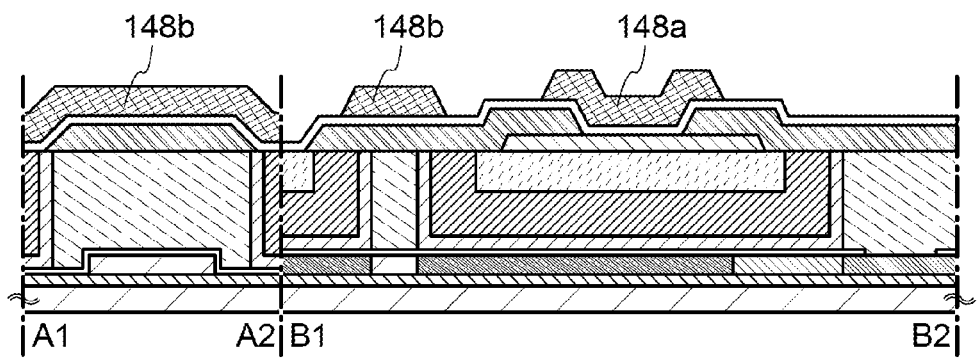

Next, a conductive layer for forming a gate electrode (including a wiring formed using the same layer as the gate electrode) is formed and is processed, so that the gate electrode 148a and the conductive layer 148b are formed (see FIG. 10D).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a stacked structure.

Figure 11A:
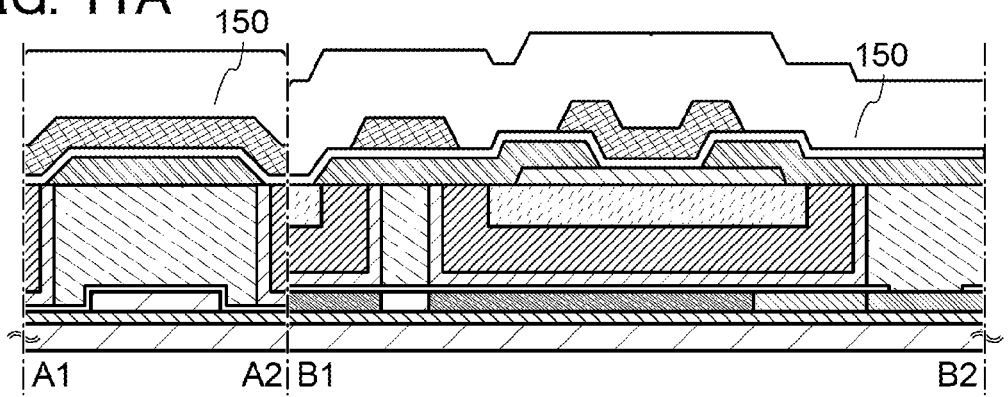
FIGS. 11A to 11C are cross-sectional views of manufacturing steps of a semiconductor device.
Figure 11B:
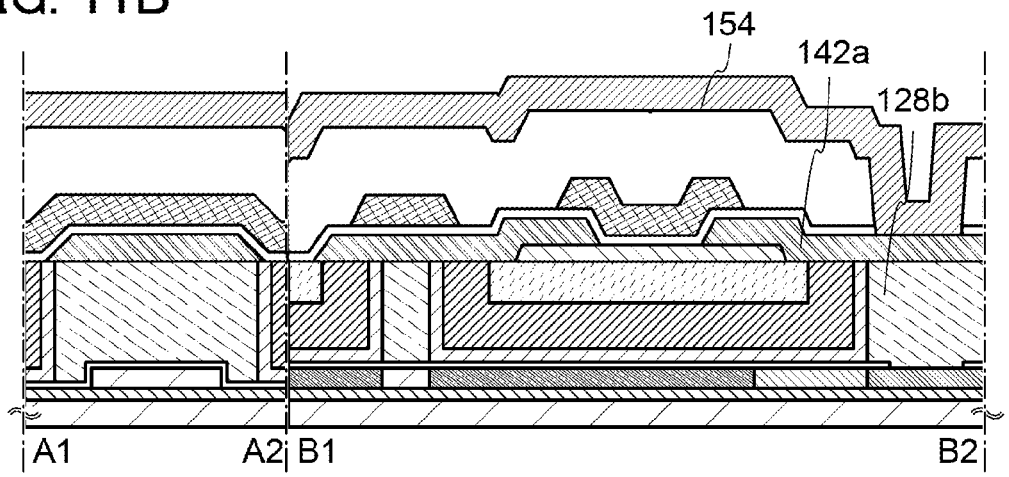

Next, an insulating layer 150 is formed over the gate insulating layer 146, the gate electrode 148a, and the conductive layer 148b (see FIG. 11A). The insulating layer 150 can be formed by a PVD method, a CVD method, or the like. The insulating layer 150 can be formed using a material containing an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) is preferably employed for the following reason: the low dielectric constant of the insulating layer 150 allows capacitance generated between wirings, electrodes, or the like to be reduced and operation speed to be increased. Although the insulating layer 150 has a single-layer structure in this embodiment, the semiconductor device relating to one embodiment of the disclosed invention is not limited thereto. The insulating layer 150 may have a stacked structure including two or more layers.

Then, an opening reaching the source electrode 142a is formed in the gate insulating layer 146 and the insulating layer 150. After that, a wiring 154 connected to the source electrode 142a is formed over the insulating layer 150 (see FIG. 11B). The opening is formed by selective etching using a mask or the like.

A conductive layer is formed by a PVD method or a CVD method and then is processed, so that the wiring 154 is formed. As a material for the conductive layer, an element selected from aluminum, chromium, copper, tantalum, titanium, molybdenum, and tungsten; an alloy containing any of these elements as a component; or the like can be used. One or more materials selected from manganese, magnesium, zirconium, beryllium, neodymium, and scandium may also be used.

Specifically, it is possible to employ a method, for example, in which a thin (about 5 nm) titanium film is formed in a region including the opening of the insulating layer 150 by a PVD method, and then, an aluminum film is formed so as to be embedded in the openings. Here, the titanium film formed by a PVD method has a function of reducing an oxide film (such as a natural oxide film) over which the titanium film is to be formed, and thereby lowering contact resistance with the lower electrode or the like (here, the source electrode 142a). In addition, hillock of the aluminum film can be prevented. A copper film may be formed by a plating method after the formation of a barrier film of titanium, titanium nitride, or the like.

The opening formed in the insulating layer 150 is preferably formed in a region overlapping with the conductive layer 128b. By forming the opening in such a region, an increase in the element area due to a contact region of electrodes can be suppressed.

Here, the case where a position where the impurity region 126 and the source electrode 142a are connected and a position where the source electrode 142a and the wiring 154 are connected overlap with each other without using the conductive layer 128b will be described. In this case, an opening (also referred to as a contact in a lower portion) is formed in the insulating layer 136, the insulating layer 138, and the insulating layer 140 which are formed over the impurity region 126, and the source electrode 142*a* is formed in the contact in the lower portion. After that, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the source electrode 142*a* formed in the contact in the lower portion might be disconnected by etching. When the contacts in the lower portion and in the upper portion are formed so as not to overlap with each other in order to avoid the disconnection, an increase in the element area is caused.

As described in this embodiment, with the use of the conductive layer 128*b*, the contact in the upper portion can be formed without disconnection of the source electrode 142*a*. Thus, the contacts in the lower portion and in the upper portion can be formed so as to overlap with each other, so that the increase in the element area due to the contact regions can be suppressed. In other words, the degree of integration of the semiconductor device can be increased.

Figure 11C:
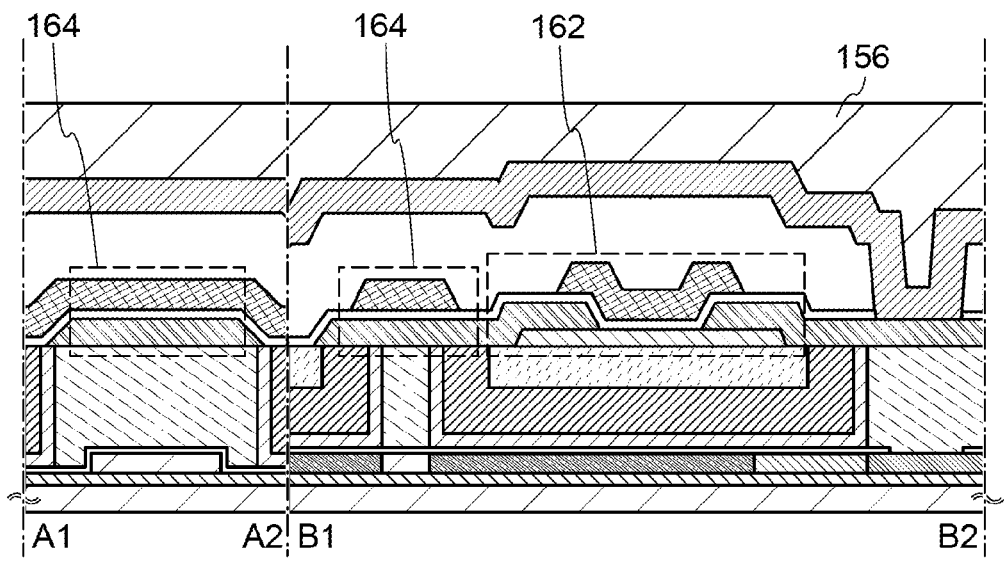

Next, an insulating layer 156 is formed so as to cover the wiring 154 (see FIG. 11C).

Through the above steps, the transistor 162 including the purified oxide semiconductor layer 144 and the capacitor 164 are completed.

Figure 13A:
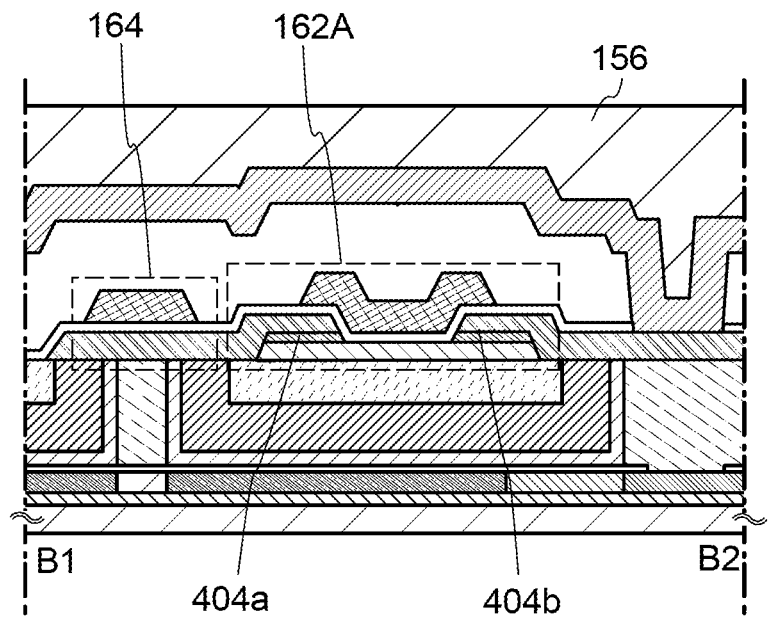
FIGS. 13A and 13B are each a cross-sectional view of a semiconductor device.
Figure 13B:
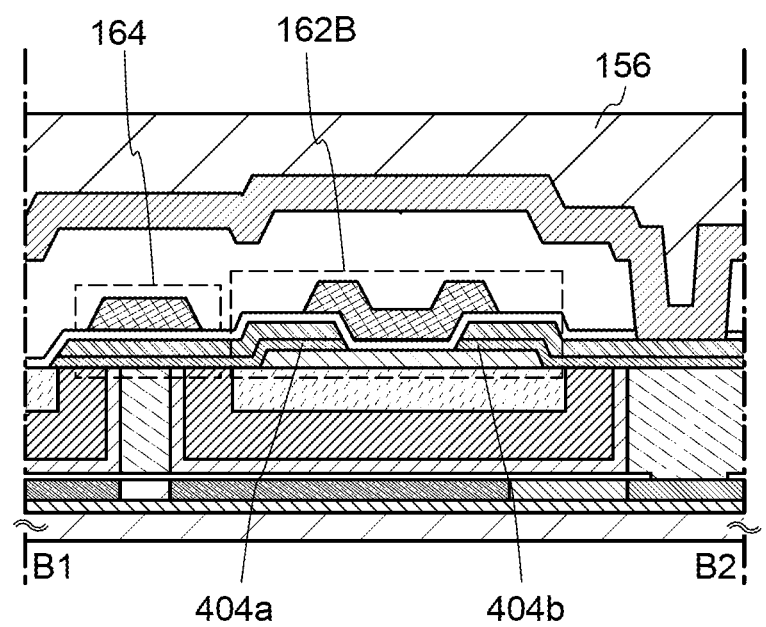

Oxide conductive layers functioning as a source region and a drain region may be provided as buffer layers between the oxide semiconductor layer 144 and the source and drain electrodes 142*a* and 142*b* in the transistor 162. FIGS. 13A and 13B illustrate a transistor 162A and a transistor 162B, respectively, where oxide conductive layers are provided in the transistor 162 in FIG. 6A.

In each of the transistors 162A and 162B in FIGS. 13A and 13B, an oxide conductive layer 404*a* and an oxide conductive layer 404*b* which function as a source region and a drain region are formed between the oxide semiconductor layer 144 and the source and drain electrodes 142*a* and 142*b*. The transistor 162A in FIG. 13A and the transistor 162B in FIG. 13B are different from each other in the shapes of the oxide conductive layers 404*a* and 404*b* depending on the formation step.

In the transistor 162A in FIG. 13A, a stack of an oxide semiconductor film and an oxide conductive film is formed and processed by the same photolithography process, so that the oxide semiconductor layer 144 having an island shape and an oxide conductive film having an island shape are formed. The source electrode 142*a* and the drain electrode 142*b* are formed over the oxide semiconductor layer and the oxide conductive film, and then the island-shaped oxide conductive film is etched using the source electrode 142*a* and the drain electrode 142*b* as masks, so that the oxide conductive layer 404*a* and the oxide conductive layer 404*b* which serve as a source region and a drain region are formed.

In the transistor 162B in FIG. 13B, an oxide conductive film is formed over the oxide semiconductor layer 144, a metal conductive film is formed over the oxide conductive film, and the oxide conductive film and the metal conductive film are processed by the same photolithography process; thus, the oxide conductive layer 404*a* and the oxide conductive layer 404*b* which serve as a source region and a drain region, the source electrode 142*a*, and the drain electrode 142*b* are formed.

For etching treatment for the processing the oxide conductive layer, the etching conditions (e.g., type of etching agent, the concentration of etching agent, and etching time) are adjusted as appropriate to prevent excessive etching of the oxide semiconductor layer.

The oxide conductive layers 404*a* and 404*b* can be formed by a sputtering method, a vacuum evaporation method (an electron beam evaporation method or the like), an arc discharge ion plating method, a spray method, or the like. As a material for the oxide conductive layers, zinc oxide, an indium tin oxide, zinc aluminum oxide, zinc aluminum oxynitride, zinc gallium oxide, or the like can be used. In addition, the above materials may contain silicon oxide.

When the oxide conductive layers are provided as a source region and a drain region between the oxide semiconductor layer 144 and the source electrode 142*a* and the drain electrode 142*b*, the source region and the drain region can have lower resistance and the transistors 162A and 162B can operate at high speed.

With the structure including the oxide semiconductor layer 144, the oxide conductive layers 404*a* and 404*b*, the source electrode 142*a*, and the drain electrode 142*b*, the withstand voltage of the transistor 162A and the transistor 162B can be improved.

Since the oxide semiconductor layer 144 in the transistor 162 described in this embodiment is highly purified, the hydrogen concentration is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. In addition, the carrier density of the oxide semiconductor layer 144 is sufficiently low (e.g., lower than $1 \times 10^{12}$/cm$^3$, preferably lower than $1.45 \times 10^{10}$/cm$^3$) compared with that of a general silicon wafer (approximately $1 \times 10^{14}$/cm$^3$). Further, the off-state current is sufficiently small. For example, the off-state current (here, per unit channel width (1 μm)) of the transistor 162 at room temperature (25° C.) is 100 zA (1 zA (zeptoampere) is $1 \times 10^{-21}$ A) or less, preferably 10 zA or less.

With the use of the highly-purified intrinsic oxide semiconductor layer 144, the off-state current of the transistor can be sufficiently reduced easily. In addition, with the use of such a transistor, a semiconductor device in which stored data can be held for an extremely long time can be obtained.

Further, in the semiconductor device described in this embodiment, a wiring can be shared; thus, a semiconductor device with sufficiently high integration can be achieved.

The structures, methods, and the like described in this embodiment can be combined as appropriate with any of the structures, methods, and the like described in the other embodiments.

Embodiment 3

In this embodiment, the case where the semiconductor device described in the above embodiments is applied to electronic devices will be described with reference to FIGS. 12A to 12F. In this embodiment, examples of the electronic device to which the semiconductor device described in any of the above embodiments is applied include a computer, a mobile phone (also referred to as a cellular phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 12A:
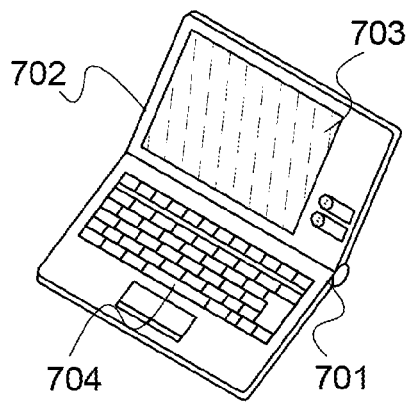
FIGS. 12A to 12F are diagrams each illustrating an electronic device including a semiconductor device.

FIG. 12A illustrates a notebook personal computer, which includes a housing 701, a housing 702, a display portion 703, a keyboard 704, and the like. The semiconductor device described in any of the above embodiments is provided in at least one of the housing 701 and the housing 702. Thus, a notebook personal computer in which writing and reading of data are performed at high speed, data is stored for a long time, and power consumption is sufficiently reduced can be realized.

Figure 12D:
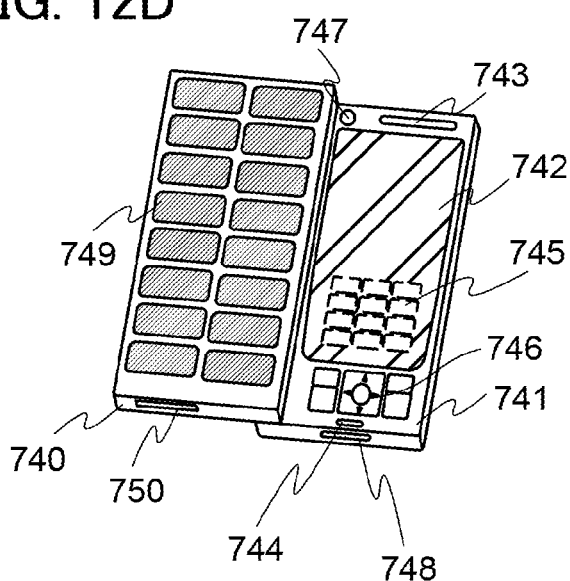
Figure 12B:
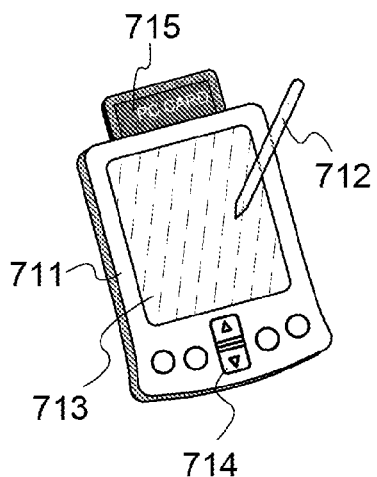

FIG. 12B illustrates a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device described in any of the above embodiments is provided. Thus, a personal digital assistant in which writing and reading of data are performed at high speed, data is stored for a long time, and power consumption is sufficiently reduced can be realized.

Figure 12E:
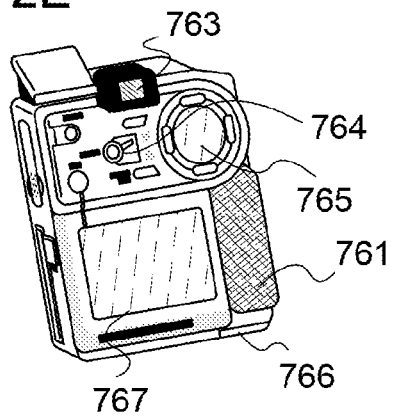
Figure 12C:
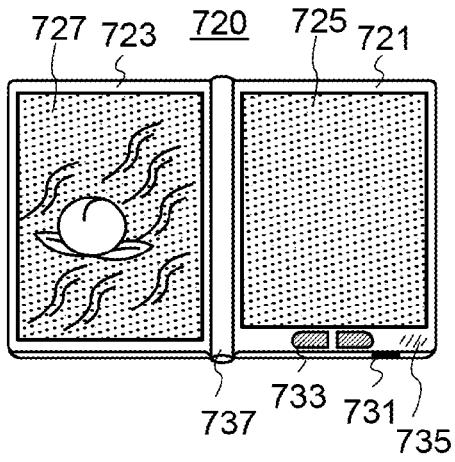

FIG. 12C illustrates an e-book reader incorporating an electronic paper. An e-book reader 720 includes a housing 721 and a housing 723. The housing 721 and the housing 723 are provided with a display portion 725 and a display portion 727, respectively. The housing 721 and the housing 723 are connected by a hinge portion 737 and can be opened or closed with the hinge portion 737. The housing 721 is provided with a power supply 731, an operation key 733, a speaker 735, and the like. At least one of the housing 721 and the housing 723 is provided with the semiconductor device described in any of the above embodiments. Thus, an e-book reader in which writing and reading of data are performed at high speed, data is stored for a long time, and power consumption is sufficiently reduced can be realized.

FIG. 12D illustrates a mobile phone, which includes a housing 740 and a housing 741. Moreover, the housing 740 and the housing 741 in a state where they are developed as illustrated in FIG. 12D can be slid so that one is lapped over the other. Thus, the size of the mobile phone can be reduced, which makes the mobile phone suitable for being carried around. The housing 741 includes a display panel 742, a speaker 743, a microphone 744, an operation key 745, a pointing device 746, a camera 747, an external connection terminal 748, and the like. The housing 740 includes a solar cell 749 for charging the cellular phone, an external memory slot 750, and the like. In addition, an antenna is incorporated in the housing 741. At least one of the housing 740 and the housing 741 is provided with the semiconductor device described in any of the above embodiments. Thus, a mobile phone in which writing and reading of data are performed at high speed, data is stored for a long time, and power consumption is sufficiently reduced can be realized.

FIG. 12E illustrates a digital camera, which includes a main body 761, a display portion 767, an eyepiece 763, an operation switch 764, a display portion 765, a battery 766, and the like. In the main body 761, the semiconductor device described in any of the above embodiments is provided. Thus, a digital camera in which writing and reading of data are performed at high speed, data is stored for a long time, and power consumption is sufficiently reduced can be realized.

Figure 12F:
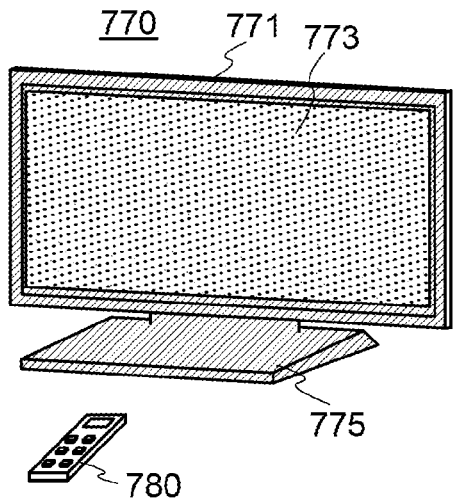

FIG. 12F illustrates a television device 770, which includes a housing 771, a display portion 773, a stand 775, and the like. The television device 770 can be operated with an operation switch of the housing 771 or a remote controller 780. The semiconductor device described in any of the above embodiments is mounted in the housing 771 and the remote controller 780. Thus, a television device in which writing and reading of data are performed at high speed, data is stored for a long time, and power consumption is sufficiently reduced can be realized.

As described above, the electronic devices described in this embodiment each include the semiconductor device according to any of the above embodiments. Thus, electronic devices with low power consumption can be realized.

This application is based on Japanese Patent Application serial no. 2011-282429 filed with Japan Patent Office on Dec. 23, 2011 and Japanese Patent Application serial no. 2012-108272 filed with Japan Patent Office on May 10, 2012, the entire contents of which are hereby incorporated by reference.

What is claimed is:

1. A driving method of a semiconductor device,
wherein the semiconductor device comprises a first transistor, a second transistor and a capacitor,
wherein a gate of the first transistor, one of a source and a drain of the second transistor and a first terminal of the capacitor are electrically connected to each other to form a node where charge is stored,
wherein one of a source and a drain of the first transistor is electrically connected to a first line,
wherein the other of the source and the drain of the first transistor is electrically connected to the other of the source and the drain of the second transistor and a second line,
wherein a gate of the second transistor is electrically connected to a third line,
wherein a second terminal of the capacitor is electrically connected to a fourth line, and
wherein the first transistor is a p-channel transistor,
the driving method comprising the steps of:
setting a potential of the second line at a second level in a holding period;
setting a potential of the first line at a first level in a reading period after the holding period;
setting a potential of the second line at a third level in a writing period before the holding period so that data "1" is written to the node, or setting a potential of the second line at the first level in the writing period so that data "0" is written to the node;
setting a potential of the first line at the first level in the writing period;
setting a potential of the third line at a level at which the second transistor is on in the writing period; and
setting a potential of the fourth line at the first level in the writing period,
wherein a potential at the second level is higher than a potential at the first level, and
wherein a potential at the third level is higher than a potential at the second level.

2. The driving method of a semiconductor device according to claim 1, wherein a channel formation region of the second transistor comprises an oxide semiconductor.

3. The driving method of a semiconductor device according to claim 1, wherein a channel formation region of the first transistor comprises silicon.

4. The driving method of a semiconductor device according to claim 1, further comprising the step of:
setting a potential of the first line at the second level in the holding period.

5. The driving method of a semiconductor device according to claim 1, further comprising the steps of:
setting a potential of the first line at the first level in the holding period; and
setting a potential of the fourth line at the third level in the holding period.

6. The driving method of a semiconductor device according to claim 1, further comprising the steps of:

setting a potential of the third line at the first level in the reading period; and setting a potential of the fourth line at the first level in the reading period, wherein the first transistor is off and a potential of the second line is maintained at the second level in the reading period to read out data "1" when a potential held in the node is at the third level, and wherein the first transistor is on and a potential of the second line is reduced to the first level in the reading period to read out data "0" when a potential held in the node is at the first level.

7. The driving method of a semiconductor device according to claim 1, further comprising the steps of:

setting a potential of the second line at the second level in the holding period;

setting a potential of the third line at the first level in the reading period; and setting a potential of the fourth line at the first level in the reading period, wherein a channel formation region of the second transistor comprises an oxide semiconductor, wherein a channel formation region of the first transistor comprises a silicon, wherein the first transistor is off and a potential of the second line is maintained at the second level in the reading period to read out data "1" when a potential held in the node is at the third level, and wherein the first transistor is on and a potential of the second line is reduced to the first level in the reading period to read out data "0" when a potential held in the node is at the first level.

8. A driving method of a semiconductor device, wherein the semiconductor device comprises a memory cell array comprising:
n second lines;
k first lines;
m third lines;
m fourth lines; and
a plurality of memory cells,
wherein n is an integer of 2 or more,
wherein k is an integer of 1 or more,
wherein m is an integer of 2 or more,
wherein each one of the plurality of the memory cells comprises a first transistor, a second transistor and a capacitor,
wherein a gate of the first transistor, one of a source and a drain of the second transistor and a first terminal of the capacitor are electrically connected to each other to form a node where charge is stored,
wherein one of a source and a drain of the first transistor is electrically connected to a first line,
wherein the other of the source and the drain of the first transistor is electrically connected to the other of the source and the drain of the second transistor and a second line,
wherein a gate of the second transistor is electrically connected to a third line,
wherein a second terminal of the capacitor is electrically connected to a fourth line, and
wherein the first transistor is a p-channel transistor,
the driving method comprising the steps of:
setting a potential of each of the n second lines at a second level in a holding period;
setting a potential of the first line electrically connected to a selected memory cell at a first level in a reading period after the holding period;

setting a potential of the second line electrically connected to the selected memory cell at a third level in a writing period before the holding period so that data "1" is written to the node, or setting a potential of the second line electrically connected to the selected memory cell at the first level in the writing period so that data "0" is written to the node;

setting a potential of the first line electrically connected to the selected memory cell at the first level in the writing period;

setting a potential of the third line electrically connected to the selected memory cell at a level at which the second transistor is on in the writing period; and setting a potential of the fourth line electrically connected to the selected memory cell at the first level in the writing period, wherein a potential at the second level is higher than a potential at the first level, and wherein a potential at the third level is higher than a potential at the second level.

9. The driving method of a semiconductor device according to claim 8, wherein a channel formation region of the second transistor comprises an oxide semiconductor.

10. The driving method of a semiconductor device according to claim 8, wherein a channel formation region of the first transistor comprises silicon.

11. The driving method of a semiconductor device according to claim 8, further comprising the step of:

setting a potential of the first line at the second level in the holding period.

12. The driving method of a semiconductor device according to claim 8, further comprising the steps of:

setting a potential of the first line at the first level in the holding period; and setting a potential of the fourth line at the third level in the holding period.

13. The driving method of a semiconductor device according to claim 8, further comprising the steps of:

setting a potential of the third line electrically connected to the selected memory cell at the first level in the reading period; and setting a potential of the fourth line electrically connected to the selected memory cell at the first level in the reading period, wherein the first transistor is off and a potential of the second line electrically connected to the selected memory cell is maintained at the second level in the reading period to read out data "1" when a potential held in the node is at the third level, and wherein the first transistor is on and a potential of the second line is reduced to the first level in the reading period to read out data "0" when a potential held in the node is at the first level.

14. The driving method of a semiconductor device according to claim 8, further comprising the steps of:

setting a potential of the second line at the second level in the holding period;

setting a potential of the third line electrically connected to the selected memory cell at the first level in the reading period; and setting a potential of the fourth line electrically connected to the selected memory cell at the first level in the reading period, wherein a channel formation region of the second transistor comprises an oxide semiconductor, wherein a channel formation region of the first transistor comprises a silicon, wherein the first transistor is off and a potential of the second line electrically connected to the selected memory cell is maintained at the second level in the reading period to read out data "1" when a potential held in the node is at the third level, and wherein the first transistor is on and a potential of the second line electrically connected to the selected memory cell is reduced to the first level in the reading period to read out data "0" when a potential held in the node is at the first level.

15. A driving method of a semiconductor device, wherein the semiconductor device comprises a first transistor, a second transistor and a capacitor, wherein a gate of the first transistor, one of a source and a drain of the second transistor and a first terminal of the capacitor are electrically connected to each other to form a node where charge is stored, wherein one of a source and a drain of the first transistor is electrically connected to a first line, wherein the other of the source and the drain of the first transistor is electrically connected to the other of the source and the drain of the second transistor and a second line, wherein a gate of the second transistor is electrically connected to a third line, wherein a second terminal of the capacitor is electrically connected to a fourth line, and wherein the first transistor is a p-channel transistor, the driving method comprising the steps of:

setting a potential of the second line at a second level in a holding period;

setting a potential of the first line at a first level in a reading period after the holding period;

setting a potential of the third line at the first level in the reading period;

setting a potential of the fourth line at the first level in the reading period; and setting a potential of the second line at a third level in a writing period before the holding period so that data "1" is written to the node, or setting a potential of the second line at the first level in the writing period so that data "0" is written to the node, wherein the first transistor is off and a potential of the second line is maintained at the second level in the reading period to read out data "1" when a potential held in the node is at the third level, wherein the first transistor is on and a potential of the second line is reduced to the first level in the reading period to read out data "0" when a potential held in the node is at the first level, wherein a potential at the second level is higher than a potential at the first level, and wherein a potential at the third level is higher than a potential at the second level.

* * * * *